United States Patent
Kusakabe et al.

[11] Patent Number: 6,107,886
[45] Date of Patent: Aug. 22, 2000

[54] HIGH-EFFICIENCY POWER AMPLIFIER

[75] Inventors: Hiromi Kusakabe; Hiroyuki Tsurumi, both of Yokohama, Japan

[73] Assignee: Kabushiki Kaisha Toshiba, Kawasaki, Japan

[21] Appl. No.: 09/275,258

[22] Filed: Mar. 23, 1999

[30] Foreign Application Priority Data

Mar. 31, 1998 [JP] Japan .................................. 10-087075

[51] Int. Cl.$^7$ ...................................................... H03F 3/04
[52] U.S. Cl. ........................................... 330/297; 330/146
[58] Field of Search ................................. 330/127, 146, 330/267, 297, 51

[56] References Cited

U.S. PATENT DOCUMENTS

| | | | |
|---|---|---|---|
| 5,479,134 | 12/1995 | Kokubo et al. | 330/124 R |
| 5,654,668 | 8/1997 | Botti et al. | 330/146 |
| 5,708,390 | 1/1998 | Dunnebacke | 330/146 |
| 5,973,555 | 10/1999 | Kokubo et al. | 330/124 R |

OTHER PUBLICATIONS

B. Murari, et al. "Smart Power ICs: Technologies and Applications", New York, Springer, 1955, pp. 416–423.
Philips Semiconductors, "40W Car Radio High Power Amplifier TDA1560Q", Data Sheet, May 14, 1996, pp. 1–12.

*Primary Examiner*—Paul Gensler
*Assistant Examiner*—Khanh Van Nguyen
*Attorney, Agent, or Firm*—Oblon, Spivak, McClelland, Maier & Neustadt, P.C.

[57] ABSTRACT

A power amplifier comprises a pair of power-supply rails, a power-supply voltage divider, an intermediate power-supply line, a first and second BTL amplifiers, and a first to fourth switching circuits. The power-supply rails are composed of a first power-supply line to which a power-supply potential is applied and a second power-supply line to which the ground potential is applied. The power-supply divider produces an intermediate potential by dividing the voltage between the power-supply rails in two and supplies it to the intermediate power-supply line. The first BTL amplifier is provided between the second power-supply line and the intermediate power-supply line. The second BTL amplifier is provided between the first power-supply line and the intermediate power-supply line. The first and second BTL amplifiers each include an output bridge circuit. At small signal input, the switching circuit connects not only the output bridge circuit of the first BTL amplifier between the intermediate power-supply line and second power-supply line, but also the output bridge circuit of the second BTL amplifier between the first power-supply line and the intermediate power-supply line. At large signal input, the switching circuit connects each of the output bridge circuits of the first and second BTL amplifiers between the power-supply rails.

20 Claims, 9 Drawing Sheets

HIGH-EFFICIENCY POWER AMPLIFIER

BACKGROUND OF THE INVENTION

This invention relates to a power amplifier formed in a semiconductor integrated circuit device, and more particularly to a high-efficiency power amplifier that amplifies audio signals on plural channels at a high efficiency and is suitable for, for example, a monolithic power amplifier IC (integrated circuit) provided in a car stereo unit.

Many power amplifiers provided in audio units, including car radios and cassette players, generally operate as class B amplifiers or as class AB bridge circuits.

It is well known that the efficiency (the ratio of the output power to the input power from the power supply) of a class B amplifier with a sine wave signal varies from approximately 0% when the output is almost zero to 78.5% ($=\pi/4$) when the output is the largest. In the case of normal musical sound signals, it is frequently used in regions with very low efficiencies. For example, when the efficiency of a class B amplifier is 20%, this means that the amplifier will dissipate about five times the audio output (100%÷20%) thermally as power consumption.

Power amplifier ICs provided in car audio units are often provided in a limited space. Therefore, it is difficult to install heat-dissipating devices, such as large heat-radiating fins. Another problem is that high heat damages the semiconductor devices in audio units or shortens their service life.

In this connection, as recent car audio units have been requiring greater power, assuring more channels, and providing more multimedia services, there have been greater demands for high-efficiency, less-heat-dissipation power amplifier systems.

Various efforts have been made to develop audio power amplifier ICs that operate from the same power with a lower heat dissipation (a low power consumption). For example, the following have been developed and produced on a commercial basis: class D amplifiers by high-frequency switching PWM (pulse-width modulation) and class G amplifiers that switch between power supplies according to the signal level (as described in reference 1: B. Murari, F. Bertotti, G. A. Vignola, "Smart Power ICs: Technologies and Applications," New York, Springer, 1955, pp. 416–419), class H amplifiers that lift up the potential of the power supply temporarily when the signal level is great (as described in reference 2: Philips Semiconductor, 40W Car Radio High Power Amplifier TDA1560Q DATA SHEET, 1996, May 14), and class SB amplifiers that switch between a bridge and a single circuit according to the signal level (as described in reference 1, pp. 419 to 423).

Although class D amplifiers have as high an efficiency as about 95%, they have fatal disadvantages for use in ordinary cars in that they require not only a large LC low-pass filter for removing carriers in high-frequency switching but also a large, heavy shielding case for preventing unnecessary radiation.

Class G amplifiers have about twice the efficiency of normal class B or class AB amplifiers in amplifying musical sound. They, however, need plural power supply rails and therefore are not suitable for use in cars with a practically single power supply rail.

Class H amplifiers have about twice the efficiency of normal class B or class AB amplifiers as class G amplifiers. They are at a disadvantage in that they need additional power amplifiers for lifting up the power supply potential and plural large-capacity capacitors.

Class SB amplifiers have the merit of achieving a similar efficiency to that of class G amplifiers by means of a single power-supply rail. They, however, have disadvantages in that they need additional bi-directional high-speed power switches and delay circuits for adjusting the timing of switching and that they make no improvement in the efficiency at the reversed-phase signals. In addition, they are limited to pairs for every two channels from the viewpoint of circuit configuration. Therefore, at non-pair channel, it is impossible to desire the effect of improving the efficiency by using a configuration with three channels or an odd number of channels more than three.

BRIEF SUMMARY OF THE INVENTION

A first object of the present invention is to provide a power amplifier capable of amplifying signals on plural channels at a high efficiency with less heat generation.

A second object of the present invention is to provide an audio-signal power amplifier suitable to realize a power amplifier system capable of amplifying audio signals on plural channels at a high efficiency with less heat generation.

The first object is accomplished by providing a power amplifier comprising: a pair of power-supply rails composed of a first power-supply line to which a power-supply potential regarded as a first potential is applied and a second power-supply line to which the ground potential regarded as (N+1)th potential is applied; a power-supply voltage divider for dividing a voltage between the power-supply rails into second to N-th potential which are sequentially higher from the first potential toward the (N+1)th potential; an (N−1) number of intermediate power-supply lines to which the second to N-th potentials are applied, respectively; first to N-th BTL amplifiers connected to receive first to N-th channel signals, respectively, first to N-th output bridge circuits provided in the first to N-th amplifiers, respectively, stacked one above another and connected between the power-supply rails; and first to N-th switching circuits provided in the first to N-th BTL amplifiers, respectively, each designed to connect the bridge circuit between one potential and the immediately higher potential when the BTL amplifier has no signals, and to change connection of the output bridge circuit when an output voltage of the BTL amplifier increases.

With this configuration, because the number of stacked stages of the first to N-th BTL amplifiers can be changed according to the signal level, it is possible to provide a power amplifier capable of amplifying signals of plural channels at a high efficiency with less heat generation.

The configuration is further provided with a bias setting circuit for setting intermediate bias voltages lower than the first divided potential to power-supply potential and higher than the ground potential to (N−1)th divided potential as the output bias potentials for the first to N-th BTL amplifiers, and a circuit for making the differential output signal waveforms of the BTL amplifiers proportional to the corresponding input signal waveforms and keeping the instantaneous differential gains of the BTL amplifiers almost constant. The resulting configuration achieves the second object. Specifically, because the added circuits reduce the distortion of the output waveform, it is possible to provide an audio-signal power amplifier suitable to realize a power amplifier system capable of amplifying audio signals of plural channels at a high efficiency with less heat generation.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
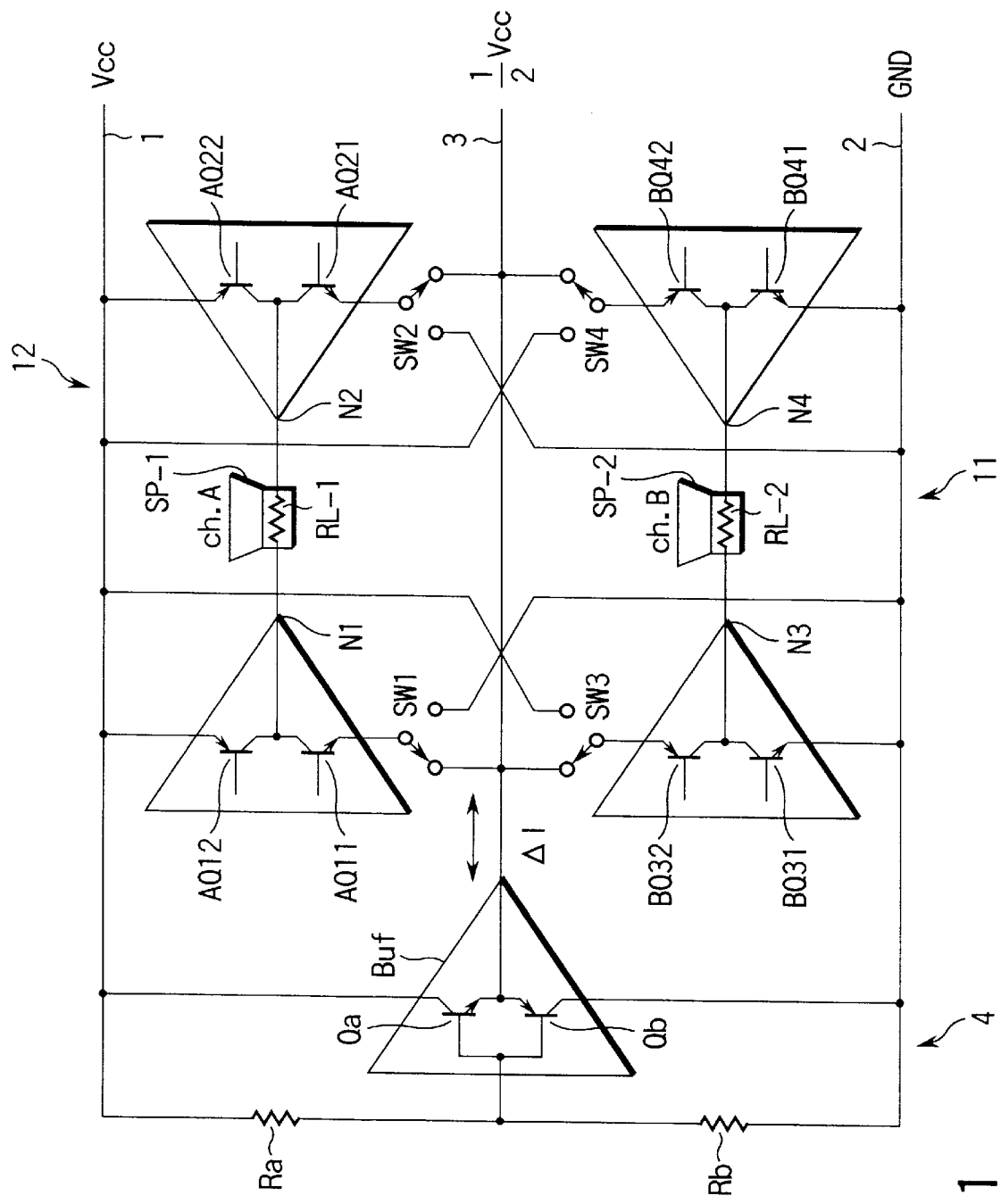
FIG. 1 is a circuit diagram illustrating the basic configuration of the two-stage stacked amplifier section in a high-efficiency power amplifier according to a first embodiment of the present invention.

FIG. 1 is a circuit diagram illustrating the basic configuration of the two-stage stacked amplifier section in a high-efficiency power amplifier according to a first embodiment of the present invention.

The two-stage stacked amplifier section of FIG. 1 includes two BTL (Bridge-Tied Load or Balanced TransformerLess) amplifiers each having an output bridge circuit with a bridge connection of output-stage transistors. Audio signals correlating a little closely with each other, such as the left-channel signal and right-channel signal in a car stereo, are inputted to the two BTL amplifiers. In the embodiment, channel B (ch. B) is allocated to the first BTL amplifier 11 and channel A (ch. A) is allocated to the second BTL amplifier 12. The two BTL amplifiers 11, 12 are provided in such a manner that the individual output bridge circuits are stacked and connected between power-supply rails 1 and 2 or they are switched so that they may be connected independently between the power-supply rails 1 and 2.

Specifically, as shown in FIG. 1, a power-supply voltage Vcc is applied to a first power-supply line (Vcc line) 1 and the ground potential GND is applied to a second power-supply line (ground line or GND line) 2. These power-supply lines constitute power-supply rails. An intermediate power-supply line 3 is provided between the power-supply rails 1, 2. A power-supply voltage divider 4 divides the power-supply voltage between the power-supply rails 1, 2 into two parts (in the embodiment, two equal parts) and applies the divided potential to the intermediate power-supply line 3. There are provided as many BTL amplifiers as the number of pieces into which the power-supply voltage divider 4 divides the voltage. Because in FIG. 1, the power-supply voltage is divided in two, two BTL amplifiers 11, 12 are provided. The first BTL amplifier 11 is provided between the power-supply line 2 and intermediate power-supply line 3 and the second BTL amplifier 12 is provided between the power-supply 1 and intermediate power-supply line 3.

Switching circuits SW1 to SW4 are provided in such a manner that they correspond to the individual bridge circuits of the BTL amplifiers 11, 12. They are designed to substantially switch the power-supply lines 1, 2, 3 to which the individual bridge circuits are to be connected in such a manner that the operating power-supply voltage of each output bridge circuit gets larger stepwise as the level of the output voltage of the corresponding BTL amplifier increases. In this case, when the levels of the output voltages of the BTL amplifiers 11, 12 have rises above or falls below a threshold value using the intermediate power-supply line 3 as a reference, switching is done in such a manner that output-stage transistors AQ11, AQ21 in the upper part (on the lower-potential side) of the output bridge circuit of the BTL amplifier or output-stage transistors BQ32, BQ42 in the lower part (on the higher-potential side) of the output bridge circuit of the BTL amplifier are connected to the power-supply line with the potential one stage beyond on the side where the threshold has been exceeded. The switching is effected in real time according to the instantaneous level of the signal.

When no signal or a small signal is inputted to each of the BTL amplifiers 11, 12, the switching circuits SW1 to SW4 connect the output bridge circuit of the second BTL amplifier 12 between the Vcc line 1 and intermediate power-supply line 3 and the output bridge circuit of the first BTL amplifier 11 between the intermediate power-supply line 3 and GND line 2. In this case, the intermediate power-supply line 3 is connected to both of the two BTL amplifiers 11, 12. In contrast, when a large signal is inputted to each of the BTL amplifiers 11, 12, switching is done in such a manner that the output bridge circuit of each of the second BTL amplifier 12 and first BTL amplifier 11 is connected between the power-supply rails 1 and 2.

The power-supply voltage divider 4 includes a resistance voltage divider and a buffer circuit Buf. The resistance voltage divider is composed of two resistive elements Ra, Rb connected in series between the power-supply rails 1, 2. The buffer circuit Buf is given a bias from the voltage dividing node of the resistance voltage divider and includes a push-pull emitter follower circuit at its output stage. The emitter follower circuit is connected between the power-supply rails 1, 2. The output node of the emitter follower circuit is connected to the intermediate power-supply line 3.

In addition, there is provided a bias setting circuit (not shown) which applies a second intermediate voltage (for example, Vcc/4 at almost the mid-point between Vcc/2 and GND) as a DC (direct current) bias potential to the pair of output nodes of the first BTL amplifiers 11 and a first intermediate voltage (for example, 3 Vcc/4 at almost the mid-point between Vcc/2 and Vcc) as a DC bias potential to the pair of output nodes of the second BTL amplifier 12. The second intermediate voltage is higher than the potential of the GND line 2 and lower than the potential (Vcc/2) of the intermediate power-supply line 3. The first intermediate voltage is higher than the potential (Vcc/2) of the intermediate power-supply line 3 and lower than the potential of the Vcc line 1.

Furthermore, there is provided a circuit (not shown) for making the differential output signal waveforms of the BTL amplifiers 11, 12 proportional to the input signal waveform and keeping the instantaneous differential gains of the BTL amplifiers 11, 12 almost constant.

The above configuration is incorporated into a power-amplifier IC. The load impedance RL-1 of a speaker SP-1 is externally connected as a load circuit across a pair of external terminals (not shown) connected to the pair of output nodes N1, N2 of the second BTL amplifier 12. In addition, the load impedance RL-2 of a speaker SP-2 is externally connected as a load circuit across a pair of external terminals (not shown) connected to the pair of output nodes N3, N4 of the first BTL amplifier 11.

Figure 2:
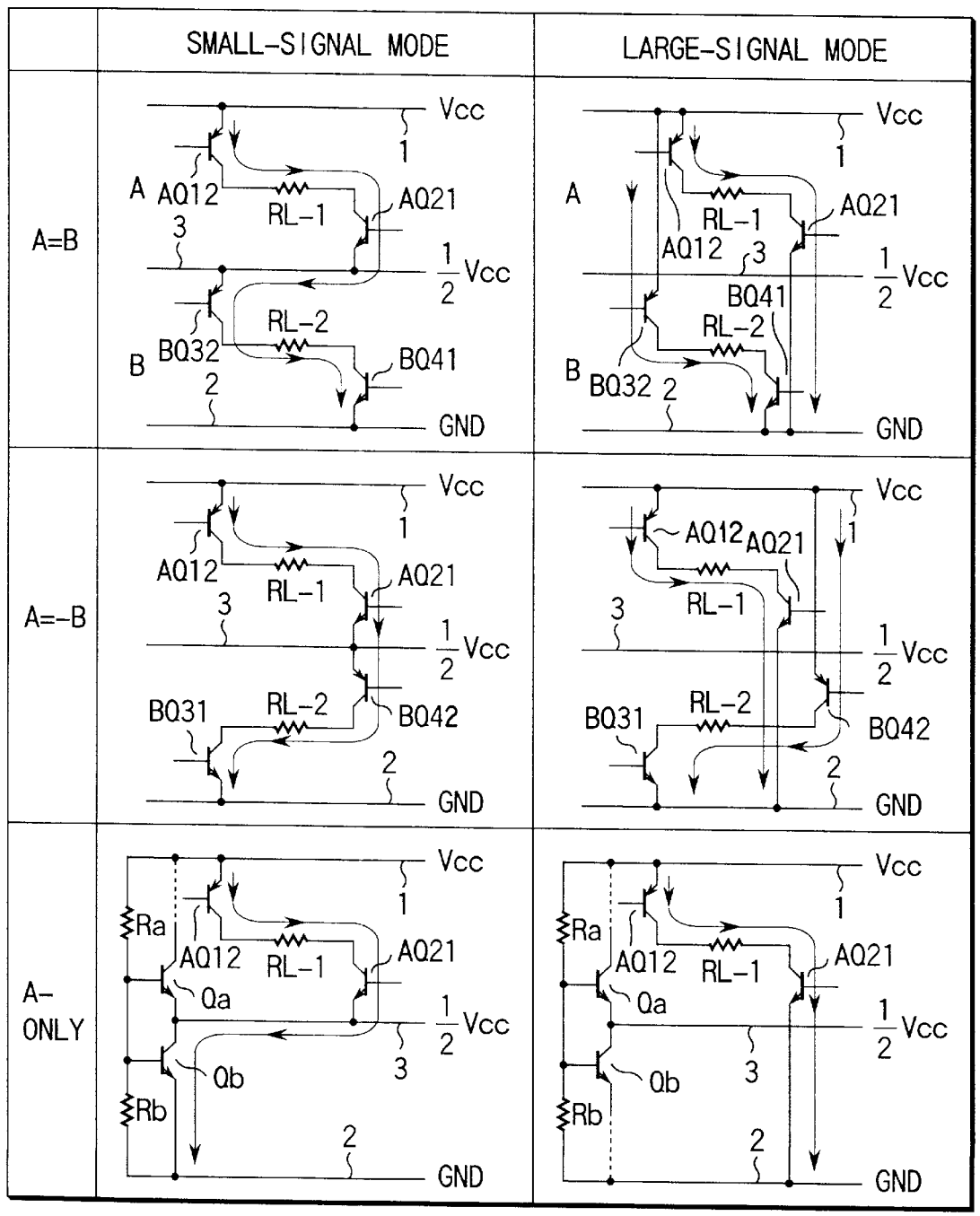
FIG. 2 is a circuit diagram to help explain the current path for the output signal of each BTL amplifier at small signal input and at large signal input in the two-stage stacked amplifier section of FIG. 1.

FIG. 2 shows current routes of the output signals of the BTL amplifiers 11, 12 at small signal input (or in the small-signal mode) and at large signal input (or in the large-signal mode) in the two-stage stacked amplifier section of FIG. 1. In FIG. 2, current routes are shown at small signal input and large-signal input for six combinations under three input conditions.

The input signal conditions are the following three: the channel A signal and channel B signal have the same amplitude and the same phase (A=B), the channel A signal and channel B signal have the same amplitude but the opposite phase to each other (A=−B), and only the channel A signal is supplied (A only). In FIG. 2, the power transistors in the cut-off state making no contribution to the operation are omitted.

Figure 3A:
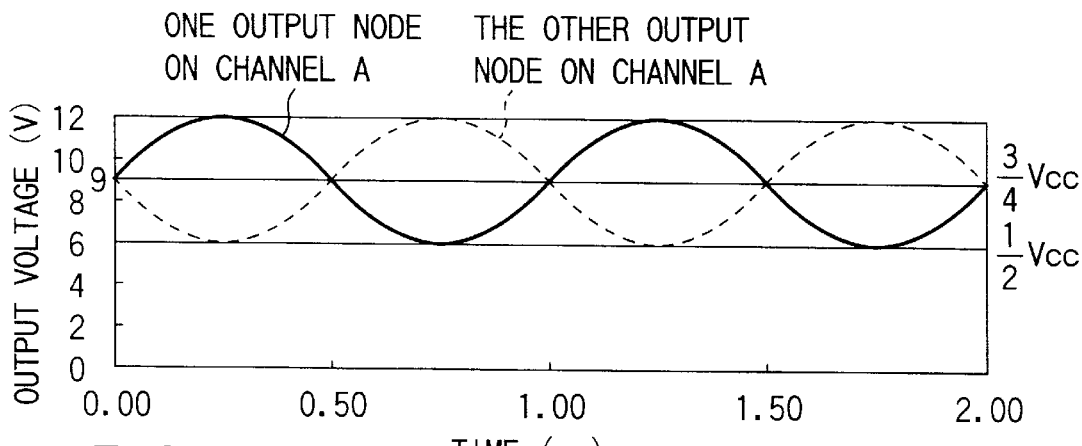
FIG. 3A shows an example of an operating waveform at small signal input in the two-stage stacked amplifier section of FIG. 1, and more specifically a theoretical voltage waveform at the pair of output nodes of a second BTL amplifier.
Figure 3B:
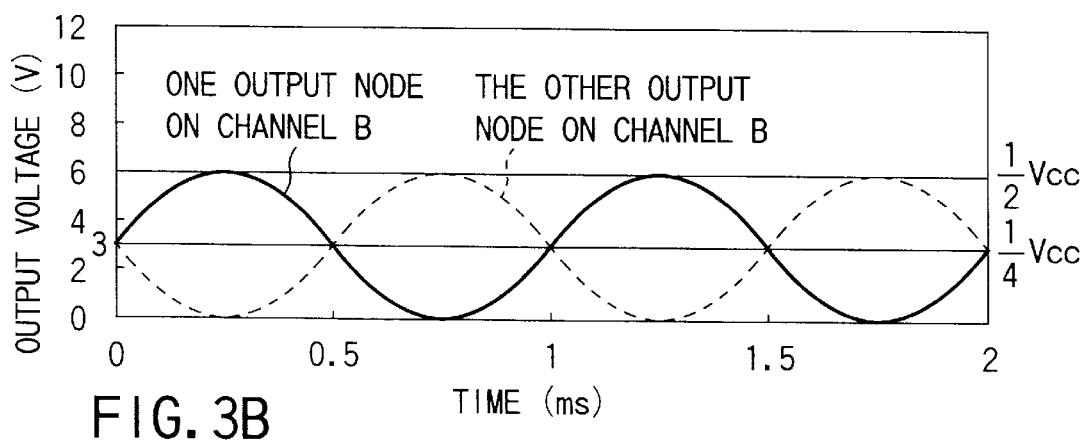
FIG. 3B shows an example of an operating waveform at small signal input in the two-stage stacked amplifier section of FIG. 1, and more specifically a theoretical voltage waveform at the pair of output nodes of a first BTL amplifier.
Figure 3C:
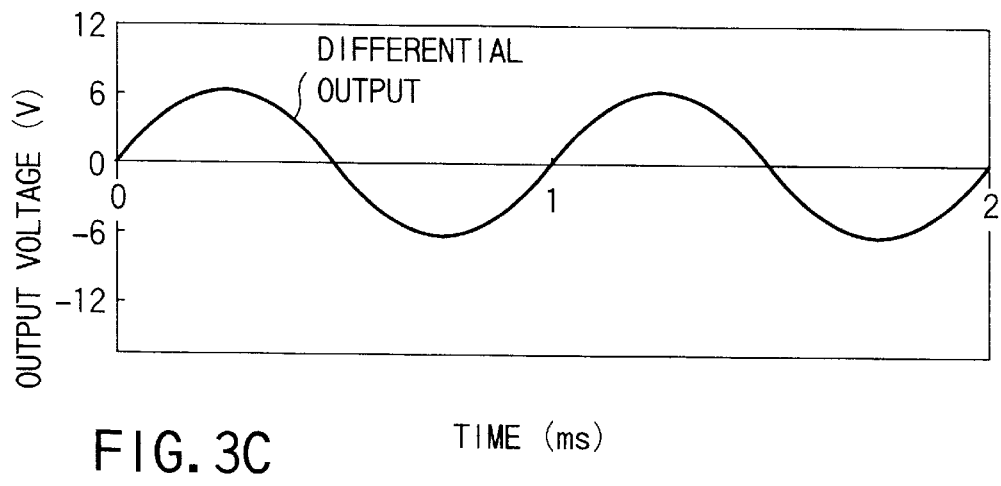
FIG. 3C shows an example of an operating waveform at small signal input in the two-stage stacked amplifier section of FIG. 1, and more specifically a differential output voltage waveform applied to the load impedance of an actual speaker.

FIGS. 3A, 3B, and 3C each show an example of an operating waveform at small signal input in the two-stage stacked amplifier section of FIG. 1. FIG. 3A is a theoretical voltage waveform diagram of the pair of output nodes N1, N2 of the second BTL amplifier 12. FIG. 3B is a theoretical voltage waveform diagram of the pair of output nodes N3, N4 of the first BTL amplifier 11. FIG. 3C is a waveform diagram of a differential output voltage applied to the load impedances RL-1, RL-2 of the actual speakers SP-1, SP-2.

Figure 4A:
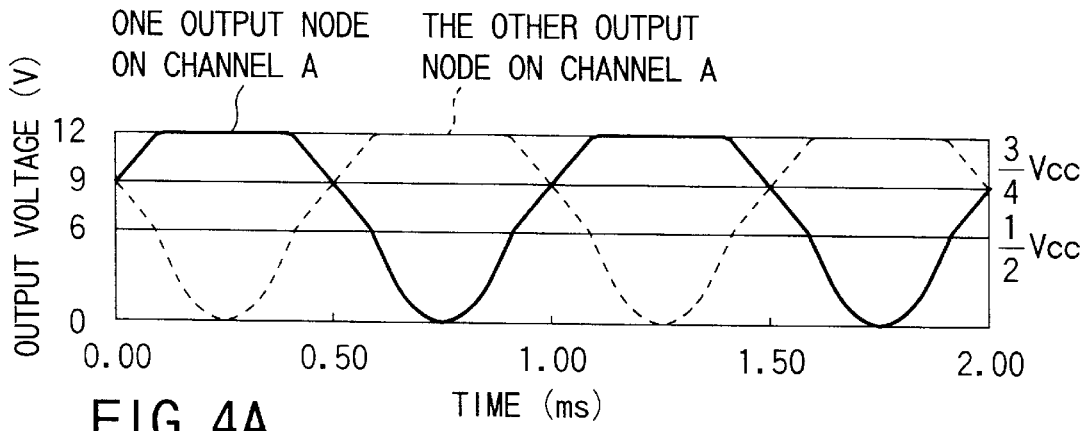
FIG. 4A shows an example of an operating waveform at large signal input in the two-stage stacked amplifier section of FIG. 1, and more specifically a theoretical voltage waveform at the pair of output nodes of the second BTL amplifier.
Figure 4B:
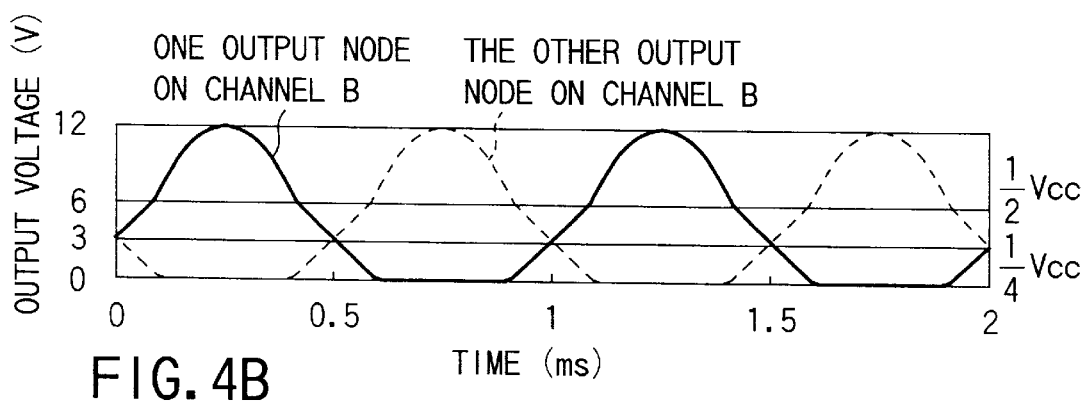
FIG. 4B shows an example of an operating waveform at large signal input in the two-stage stacked amplifier section of FIG. 1, and more specifically a theoretical voltage waveform at the pair of output nodes of the first BTL amplifier.
Figure 4C:
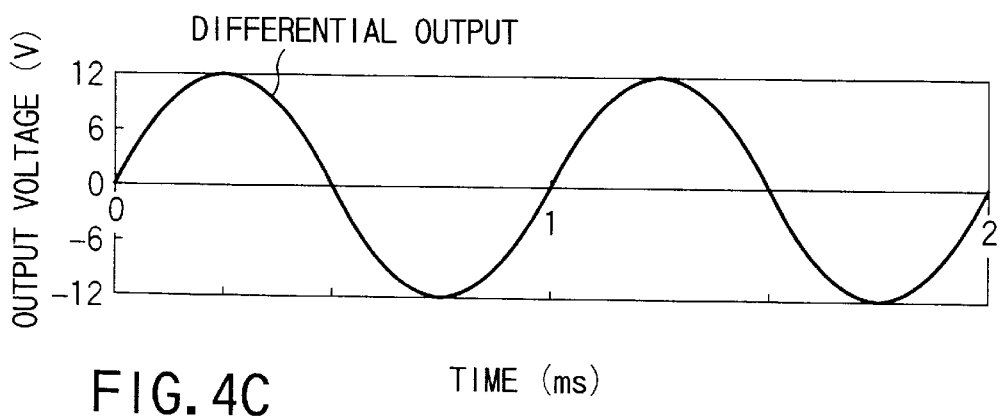
FIG. 4C shows an example of an operating waveform at large signal input in the two-stage stacked amplifier section of FIG. 1, and more specifically the differential output voltage waveform applied to the load impedance of the actual speaker.

FIGS. 4A, 4B, and 4C each show an example of an operating waveform at large signal input in the two-stage stacked amplifier section of FIG. 1. FIG. 4A is a theoretical voltage waveform diagram of the pair of output nodes N1, N2 of the second BTL amplifier 12. FIG. 4B is a theoretical voltage waveform diagram of the pair of output nodes N3, N4 of the first BTL amplifier 11. FIG. 4C is a waveform diagram of a differential output voltage applied to the load impedances RL-1, RL-2 of the actual speakers SP-1, SP-2.

The operation of the two-stage stacked amplifier section of FIG. 1 will be explained briefly by reference to FIG. 2, FIGS. 3A to 3C, and FIGS. 4A to 4C.

In the two-stage stacked amplifier section of FIG. 1, the DC bias potential applied to the pair of output nodes N3, N4 of the first BTL amplifier 11 is Vcc/4 and the DC bias potential applied to the pair of outputs nodes N1, N2 of the second BTL amplifier 12 is 3 Vcc/4.

At no signal or small signal input, the BTL amplifiers 11, 12 function as BTL amplifiers with a substantial operating power-supply voltage of Vcc/2. In this case, when the channel A signal has the same phase as that of the channel B signal, the output signal current of the BTL amplifier 12 takes the following route as shown at the top left of the table in FIG. 2: from the power-supply line 1 to the emitter and collector of the transistor AQ12, the load impedance (load circuit) RL-1 of the speaker SP-1, and the collector and emitter of the transistor AQ21, and to the intermediate power-supply line 3. The output signal current of the BTL amplifier 11 takes the following route: from the intermediate power-supply line 3 to the emitter and collector of the transistor BQ32, the load impedance RL-2 of the speaker SP-2, and the collector and emitter of the transistor BQ41, and to the power-supply line 2.

When the channel A signal has the opposite phase to that of the channel B signal, the output signal current of the BTL amplifier 12 takes the following route as shown in the middle left of the table in FIG. 2: from the power-supply line 1 to the emitter and collector of the transistor AQ12, the load impedance RL-1 of the speaker SP-1, and the collector and emitter of the transistor AQ21, and to the intermediate power-supply line 3. The output signal current of the BTL amplifier 11 takes the following route: from the intermediate power-supply line 3 to the emitter and collector of the transistor BQ42, the load impedance RL-2 of the speaker SP-2, and the collector and emitter of the transistor BQ31, and to the power-supply line 2.

Furthermore, when channel A has a small signal and channel B has no signal, the output signal current of the BTL amplifier 12 takes the following route as shown in the bottom left of the table in FIG. 2: from the power-supply line 1 to the emitter and collector of the transistor AQ12, the load impedance RL-1 of the speaker SP-1, and the collector and emitter of the transistor AQ21, and to the intermediate power-supply line 3, and the emitter and collector of the transistor Qb, and to the power-supply line 2.

As described above, the BTL amplifier 12 operates on the voltage between the power-supply line 1 and intermediate power-supply line 3 and the BTL amplifier 11 operates on the voltage between the intermediate power-supply line 3 and power-supply line 2. Therefore, the BTL amplifiers 11, 12 function as BTL amplifiers with a substantial operating power-supply voltage of Vcc/2. In this case, the difference ΔI between the operating currents of the BTL amplifiers 11, 12 is absorbed by the buffer circuit Buf of the power-supply voltage divider 4.

In contrast, at large signal input, the BTL amplifiers 11, 12 function as BTL amplifiers with an operating power-supply voltage of Vcc. In this case, when the channel A signal has the same phase as that of the channel B signal, the output signal current of the BTL amplifier 12 takes the following route as shown at the top right of the table in FIG. 2: from the power-supply line 1 to the emitter and collector of the transistor AQ12, the load impedance RL-1 of the speaker SP-1, and the collector and emitter of the transistor AQ21, and to the power-supply line 2. The output signal current of the BTL amplifier 11 takes the following route: from the power-supply line 1 to the emitter and collector of the transistor BQ32, the load impedance RL-2 of the speaker SP-2, and the collector and emitter of the transistor BQ41, and to the power-supply line 2.

When the channel A signal has the opposite phase to that of the channel B signal, the output signal current of the BTL amplifier 12 takes the following route as shown in the middle right of the table in FIG. 2: from the power-supply line 1 to the emitter and collector of the transistor AQ12, the load impedance RL-1 of the speaker SP-1, and the collector and emitter of the transistor AQ21, and to the power-supply line 2. The output signal current of the BTL amplifier 11 takes the following route: from the power-supply line 1 to the emitter and collector of the transistor BQ42, the load impedance RL-2 of the speaker SP-2, and the collector and emitter of the transistor BQ31, and to the power-supply line 2.

Furthermore, when channel A has a large signal and channel B has no signal, the output signal current of the BTL amplifier 12 takes the following route as shown in the bottom right of the table in FIG. 2: from the power-supply line 1 to the emitter and collector of the transistor AQ12, the load impedance RL-1 of the speaker SP-1, and the collector and emitter of the transistor AQ21, and to the power-supply line 2.

In FIG. 2, the current route in a half cycle of the signal is shown. In the next half cycle where the phase is opposite, current flows in the output-stage transistors (not shown) on the opposite side. Such operations are repeated alternately, thereby supplying the output currents to the load impedances RL-1, RL-2 of the speakers SP-1, SP-2.

With the two-stage stacked amplifier section of the configuration as shown in FIG. 1, at the optimum signal level and phase (with the non-clip maximum amplitude in the small-signal mode and all the BTL amplifiers having the same level output of the same or opposite phase), it is clear from calculations later described that the theoretical power efficiency is twice that of a conventional class B amplifier, the theoretical power consumption (heat generation) has the best value and is reduced remarkably to about 1/5.7 of that of the conventional class B amplifier.

Although the explanation has been given on the assumption that the audio signal is amplified, when the distortion of the output signal is not a problem as in an actuator driver, there is no need to provide the bias setting circuit and a circuit for keeping the instantaneous differential gains of the BTL amplifiers 11, 12 almost constant.

With such a configuration, too, it is possible to provide a power amplifier capable of amplifying signals on plural channels at a high efficiency with less heat generation.

<Example> (Two-stage Stacked Amplifier Section)

Figure 5:
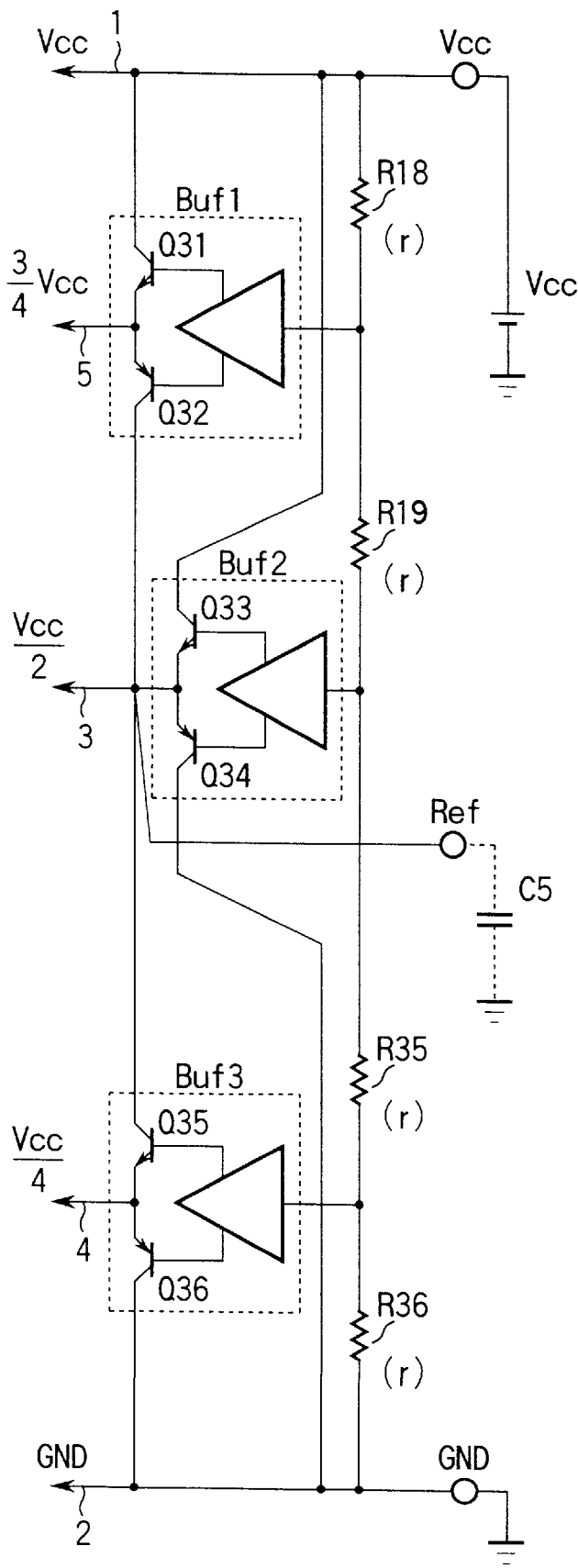
FIG. 5 is a diagram to help explain a concrete circuit in the two-stage stacked amplifier section of FIG. 1, and more specifically a circuit diagram of the power-supply voltage divider.
Figure 6:
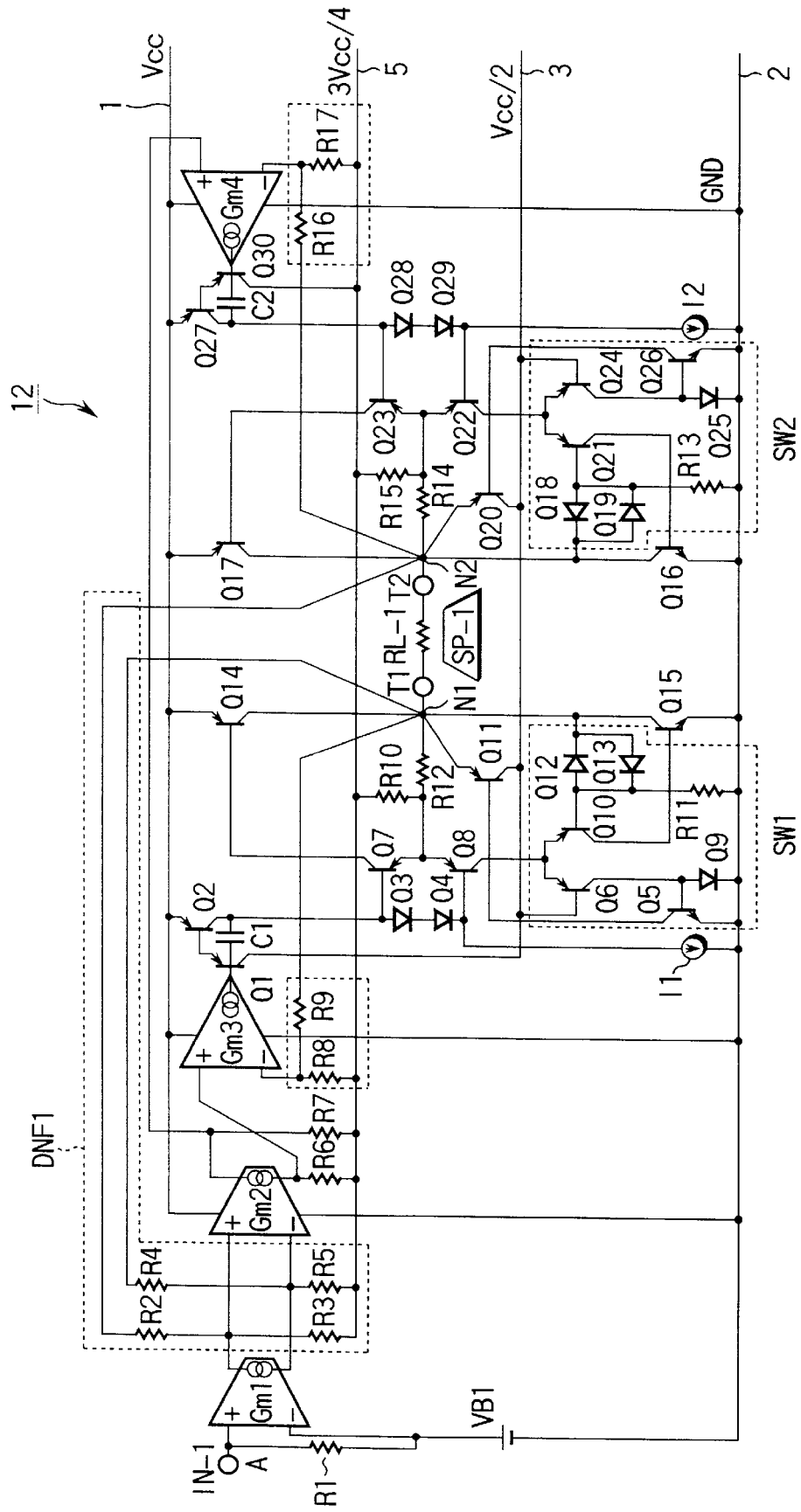
FIG. 6 is a diagram to help explain a concrete circuit in the two-stage stacked amplifier section of FIG. 1, and more specifically a circuit diagram of the second BTL amplifier.
Figure 7:
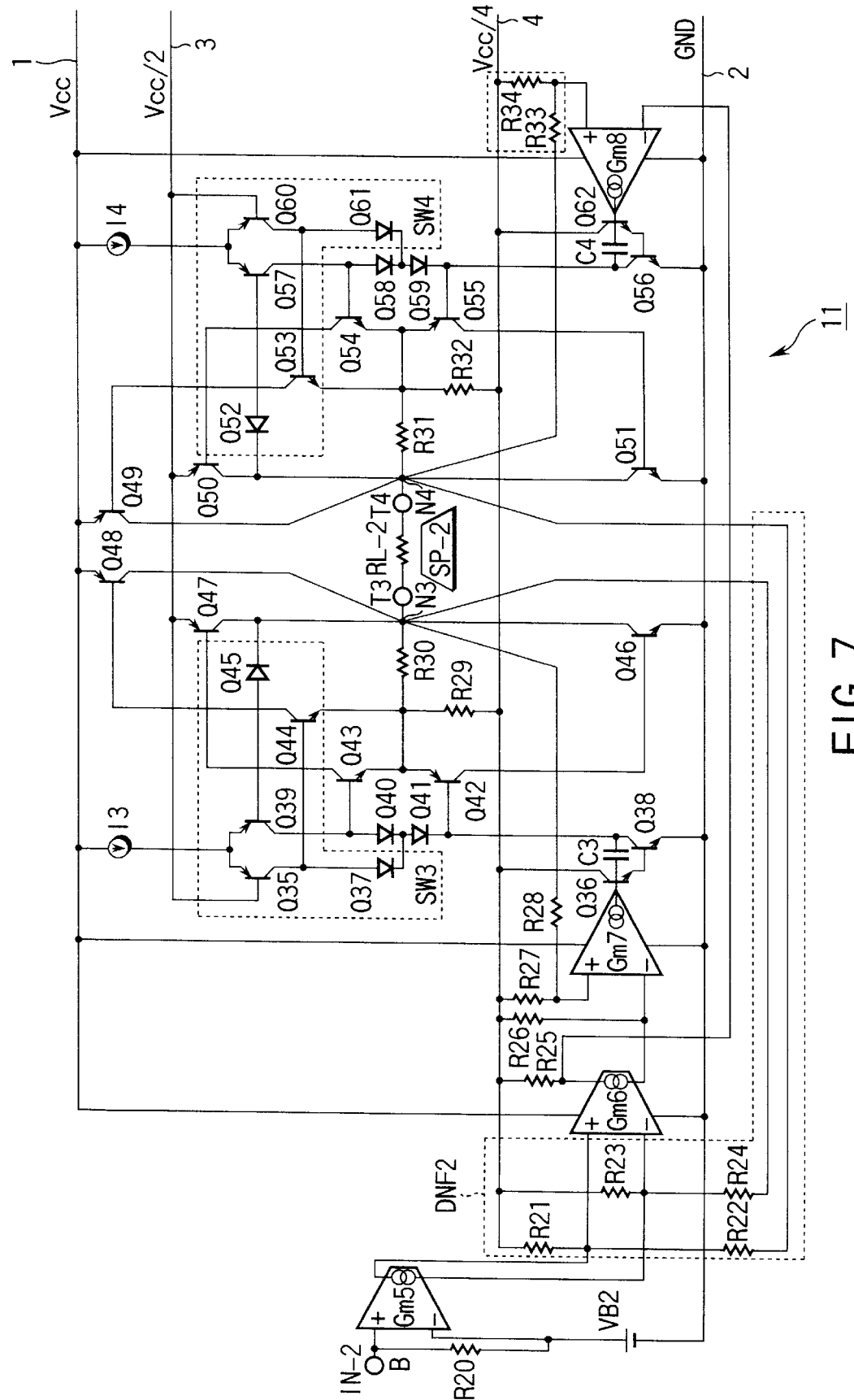
FIG. 7 is a diagram to help explain a concrete circuit in the two-stage stacked amplifier section of FIG. 1, and more specifically a circuit diagram of the first BTL amplifier.

FIGS. 5 to 7 show concrete examples of circuits in the two-stage stacked amplifier section shown in FIG. 1. The power-supply voltage divider 4, second BTL amplifier 12, first BTL amplifier 11 of FIG. 1 are shown in FIG. 5, 6, and 7, respectively.

As shown in FIG. 5, the power-supply voltage divider 4 includes four resistive elements R18, R19, R35, R36 each having a resistance of r and three buffer amplifiers Buf1, Buf2, Buf3 to which potentials of the three voltage dividing nodes of the four resistive elements R18, R19, R35, R36 are applied as bias. The emitter follower circuit of the output section of the buffer amplifier Buf1 is composed of an NPN transistor Q31 and a PNP transistor Q32. The emitter follower circuit of the output section of the buffer amplifier Buf2 is composed of an NPN transistor Q33 and a PNP transistor Q34. The emitter follower circuit of the output section of the buffer amplifier Buf3 is composed of an NPN transistor Q35 and a PNP transistor Q36. The power-supply voltage divider 4 divides the voltage between the power-supply rails 1, 2 to produce three divided potentials Vcc/4, Vcc/2, and 3 Vcc/4. The divided potential Vcc/4 is supplied to an intermediate power-supply line 4 as the DC output bias for the first BTL amplifier 11. The divided potential Vcc/2 is supplied to the intermediate power-supply line 3. The divided potential 3 Vcc/4 is supplied to an intermediate power-supply line 5 as the DC output bias for the second BTL amplifier 12. As described above, the power-supply voltage divider 4 also functions as a bias setting circuit for applying the DC bias potentials to the pairs of output nodes of the first and second BTL amplifiers 11, 12.

When the output node of each of the buffer amplifiers Buf1, Buf2, Buf3 is connected to an external terminal as the need arises, and a capacitor for bypassing low-frequency signals is externally connected to the external terminal, this enables the stabilization of the operation. Particularly when the intermediate power-supply line 3 for supplying the divided potential Vcc/2 is connected to an external terminal Ref and a large-capacity bypass capacitor C5 is externally connected to the external terminal Ref, the efficiency of using the power supply is further improved. The reason is that the capacitor C5 absorbs the instantaneous differential current ΔI, charges, and discharges, thus reducing the wasteful current drawn in the buffer amplifier Buf2.

As shown in FIG. 6, the second BTL amplifier 12 is composed of an input terminal IN-1 to which an input signal A is supplied, gm amplifiers Gm1 to Gm4, output driving control PNP transistors Q1, Q2, Q30, Q27, feedback capacitors C1, C2, an output-stage driving NPN transistor Q7 and PNP transistor Q8, and NPN transistor Q23 and PNP transistor Q22, temperature-characteristic compensation diodes Q3, Q4, Q28, Q29, current sources I1, I2, output-stage PNP transistors Q14, Q11, Q17, Q20 and NPN transistors Q15, Q16, output-DC-bias-supply resistive elements R10, R12, R15, R14, feedback resistive elements R8, R9, R16, R17, a first differential feedback circuit DNF1 (resistive elements R2 to R5), and switching circuits SW1, SW2. A pare of external terminals T1, T2 is connected to the pair of output nodes N1, N2. The load impedance RL-1 of the speaker SP-1 is connected between the external terminals T1 and T2.

In the second BTL amplifier 12, the input signal A is supplied to the input terminal IN-1. The input signal A is supplied to the noninverting input node (+) of the gm amplifier Gm1. A direct-current power supply applies a bias voltage VB1 to the inverting node (−) of the gm amplifier Gm1. The resistive element R1 is connected between the pair of input nodes (+) and (−) of the gm amplifier Gm1. The gm amplifier Gm2 is connected to the output side of the gm amplifier Gm1. The gm amplifiers Gm3 and Gm4 are connected to the output side of the gm amplifier Gm2.

The output driving control PNP transistors Q1, q2 are Darlington-connected on the output side of the gm amplifier Gm3. The feedback capacitor. C is connected between the collector of the transistor Q2 and the base of the transistor Q1. The output-stage driving NPN transistor Q7 and PNP transistor Q8 whose polarities are complementary to each other are driven by the transistor Q2. The temperature characteristic compensation diodes (diode-connected transistors) Q3 and Q4 are connected in series between the bases of the output-stage driving transistors Q7, Q8. The current source I1 is connected in series with the diodes Q3, Q4.

The output driving control PNP transistors Q30, Q27 are Darlington-connected on the output side of the gm amplifier Gm4. The feedback capacitor C2 is connected between the collector of the transistor Q27 and the base of the transistor Q30. The output-stage driving NPN transistor Q23 and PNP transistor Q22 whose polarities are complementary to each other are driven by the transistor Q27. The temperature characteristic compensation diodes Q28 and Q29 are connected in series between the bases of the output-stage driving transistors Q23, Q22. The current source I2 is connected in series with the diodes Q28, Q29.

The PNP transistors Q14, Q11, Q17, Q20 and NPN transistors Q15, Q16 are output-stage power transistors constituting an output bridge circuit. They are connected so as to form a different output bridge circuit, depending on whether the BTL amplifier 12 is at small signal input or large signal input. Specifically, the emitters and collectors of the power transistors Q14, Q11 are connected in series between the Vcc line 1 and intermediate power-supply line (Vcc/2). The emitter and collector of the power transistor Q14 and the collector and emitter of the transistor Q15 are connected in series between the power-supply rails 1, 2. In addition, the emitters and collectors of the power transistors Q17, Q20 are connected in series between the Vcc line 1 and intermediate power-supply line (Vcc/2) 3. The emitter and collector of the power transistor Q17 and the collector and emitter of the transistor Q16 are connected in series between the power-supply rails 1, 2.

The pair of external terminals T1, T2 is connected to the connection node (a first output node N1) of the collectors of the transistors Q14, Q15 and the emitter of the transistor Q11 and the connection node (a second output node N2) of the collectors of the transistors Q17, Q16 and the emitter of the transistor Q20, that is, to the pair of output nodes N1, N2 of the output bridge circuit.

Depending on whether the BTL amplifier 12 is at small signal input or large signal input, the power transistors Q11, Q15 are selectively brought into the active state and selectively receive a driving signal according to the signal input level. The transistor Q14 connected to both of the transistors Q11, Q15 is constantly kept in the active state and receives a driving signal proportional to the signal input level. In addition, depending on whether the BTL amplifier 12 is at small signal input or large signal input, the power transistors Q20, Q16 are selectively brought into the active state and selectively receive a driving signal. The transistor Q17 connected to both of the transistors Q20, Q16 is constantly kept in the active state and receives a driving signal proportional to the signal input level.

In other words, the pair of transistors Q11, Q20 and the pair of transistors Q15, Q16 are selectively brought into the active state, depending on whether the operation is at small signal input or large signal input. As a result, at small signal input, the output bridge circuit whose first to fourth sides are composed respectively of the transistors Q14, Q11, Q17, and Q20 is selectively used. At large signal input, the output bridge circuit whose first to fourth sides are composed respectively of the transistors Q14, Q15, Q17, and Q16 is selectively used.

On the other hand, the resistive elements R10, R12, R15, and R14 supply the DC bias potential of 3 Vcc/4 to the pair of output nodes N1, N2 of the output bridge circuit. The resistive elements R10, R12 are connected in series between the intermediate power-supply line 4 with the DC bias potential of 3 Vcc/4 and the first output node N1 of the output bridge circuit. In addition, the resistive elements R15, R14 are connected in series between the intermediate power-supply line 4 with the DC bias potential of 3 Vcc/4 and the second output node N2 of the output bridge circuit. The connection node of the resistive elements R10, R12 is connected to the emitters of the output-stage driving transistors Q7, Q8. The connection node of the resistive elements R15, R14 is connected to the emitters of the output-stage driving transistors Q23, Q22. In other words, the potentials of the pair of output nodes N1, N2 of the output bridge circuit are fed back to the output-stage driving transistors Q7, Q8 and Q23, Q22.

The resistive elements R9, R8, R16, R17 feed back the node N1 and N2 signals of the BTL amplifier 12 to the reference input nodes of the gm amplifiers Gm3 and Gm4. The resistive elements R9, R8 are connected in series between the first output node N1 of the output bride circuit and the intermediate power-supply line 5 with the DC bias potential of 3 Vcc/4. The connection node of the resistive elements R9, R8 is connected to the inverting input node (−) of the gm3 amplifier GM3. The resistive elements R16, R17 are connected in series between the second output node N2 of the output bride circuit and the intermediate power-supply line 5 with the DC bias potential of 3 Vcc/4. The connection node of the resistive elements R16, R17 is connected to the inverting input node (−) of the gm3 amplifier GM4.

Furthermore, in the embodiment, the first differential feedback circuit DNF1 composed of the resistive elements R2 to R5 is provided as a circuit for making the differential output signal waveform of the second BTL amplifier 12 proportional to the input signal waveform at the input terminal IN-1 and keeping the instantaneous differential gain of the second BTL amplifier 12 almost constant. The resistive elements R2, R4 are connected between the pair of output nodes N1, N2 of the output bridge circuit and the pair of input nodes of the gm amplifier Gm2. The resistive elements R3, R5 are connected between the pair of input nodes of the gm amplifier Gm2 and the intermediate power-supply line 5 with the DC bias potential of 3 Vcc/4.

The switching circuit SW1 is provided to selectively bring the transistors Q11, Q15 into the on state, depending on whether the operation is at small signal input or large signal input. In the embodiment, a differential circuit is used as the switching circuit SW1. The differential circuit compares the output voltage (output amplitude) of the BTL amplifier 12 with the voltage at the intermediate power-supply line 3 connected to the output-stage transistors Q11 of the BTL amplifier 12. Depending on the result of the comparison, the differential circuit places one of the transistors Q11, Q15 in the active state, supplies a driving signal proportional to the signal input level, and applies a bias to the other transistor to place it in the cut-off state.

Specifically, the differential circuit includes transistors Q6, Q10 and a diode (diode-connection transistor) Q9, which are for a differential switch, and an NPN transistor Q5, diodes Q12, Q13, and a resistive element R11, which are for output driving control. The emitter common connection node of the transistors Q6, Q10 is connected to the collector of the output driving control transistor Q8. The base of the transistor Q6 is connected to the collector (the intermediate power-supply line 3 with Vcc/2) of the transistor Q11. The base of the transistor Q10 is connected to the first output node N1 of the output bridge circuit by way of the level shift diode Q12 in the forward direction. The collector of the transistor Q6 is connected to the GND line 2 by way of the diode Q9 in the forward direction. The transistor Q5 has its base connected to the anode (or the collector-base connection node) of the diode Q9 and its emitter connected to the GND line 2 (that is, connected to the diode Q9 so as to form a current mirror circuit). The collector of the transistor Q5 is connected to the base of the small signal driving power transistor Q11. The differential switch transistor Q10 has its collector connected to the base of the large signal driving power transistor Q15 and its base connected to the GND line 2 via the resistive element R11 and to the first output node N1 of the output bridge circuit by way of the diode Q13 in the reverse direction.

On the other hand, the switching circuit SW2 for selectively turning on the transistors Q20, Q16, depending on whether the operation is at small signal input or large signal input, is provided. The switching circuit SW2 includes a differential circuit constructed in a similar manner to that in the switching circuit SW1. The differential circuit includes PNP transistors Q24, Q21, a diode Q25, which are for a differential switch, and an NPN transistor Q26, diodes Q18, Q19, and a resistive element R13, which are for output driving control. The emitter common connection node of the transistors Q24, Q21 is connected to the collector of the output driving control transistor Q22.

The output voltage of the BTL amplifier 12 may falls below a threshold value which is similar Vcc/2 assigned to one of the intermediate power-supply lines. In this case, the switching circuits SW1 and SW2 connect the output-stage transistors (provided in the lower part of the output bridge circuit) to a power-supply line assigned with the voltage which is lower than the threshold value and which is more similar to the threshold value than the voltage assigned to any other power-supply line (in the embodiment, the GND line). Further, the switching circuits SW1 and SW2 changes the driving current of the output-stage transistors.

On the other hand, as shown in FIG. 7, the first BTL amplifier 11 includes an input terminal IN-2 to which an input signal B is inputted, gm amplifiers Gm5 to Gm8, NPN transistors Q36, Q28, Q62, Q56 Darlington-connected to each other for output driving control, feedback capacitors C3, C4, a PNP transistor Q42 and NPN transistor Q43 and a PNP transistor Q55 and NPN transistor Q54 for output-stage driving, diodes Q40, Q41, Q58, Q59 for temperature characteristic compensation, current sources I3, I4, PNP transistors Q48, Q47, Q49, Q50 and NPN transistors Q46, Q51 at the output stage, resistive elements R29, R30, R32, R31 for output DC bias supply, feedback resistive elements R28, R27, R33, R34, a second differential feedback circuit DNF2 (resistive elements R21 to R24), and switching circuits SW3, SW4. A pair of external terminals T3, T4 is connected to the pair of output nodes N3, N4. The load impedance RL-2 of the speaker SP-2 is connected between the external terminals T3, T4.

The input signal B and a bias voltage VB2 are supplied to the pair of input nodes (+), (−) of the gm amplifier Gm5 at the first stage, respectively. A resistive element R20 is connected between the input nodes (+), (−).

The configuration of the first BTL amplifier 11 is basically the same as that of the second BTL amplifier 12 except for the configuration of the switching circuits SW3, SW4. The reason is that because of the limitation of the present process, V (vertical)—PNP transistors Q35, Q39 and Q57, Q60 whose reverse withstand voltage between the base and emitter is large are used for the differential switches.

Specifically, the switching circuit SW3 includes differential switch PNP transistors Q35, Q39, an NPN transistor Q44 and diodes Q37, Q45 for output-stage driving. The current source I3 is connected between the emitter common connection node of the differential switch transistors Q39, Q35 and the Vcc line 1. The differential switch transistor Q39 has its base connected to the first output node N3 of the output bridge circuit by way of a level shift diode Q45 in the forward direction and its collector connected to the base of the output-stage driving transistor Q43. The collector of the transistor Q43 is connected to the base of the small-signal driving power transistor Q47.

The differential switch transistor Q35 has its base connected to the emitter (the intermediate power-supply line 3 with Vcc/2) of the small-signal driving power transistor Q47 and its collector connected to the connection node of the diodes Q40, Q41 for temperature characteristic compensation by way of the diode Q37 in the forward direction and to the base of the output-stage driving transistor Q44. The output-stage driving transistor Q44 has its emitter connected to the emitters of the output-stage driving transistors Q42, Q43 and its collector connected to the base of the large-signal driving power transistor Q48.

The switching circuit SW4 is for selectively turning on the power transistors Q49, Q50, depending on whether the operation is at small signal input or large signal input. Like the switching circuit SW3, the switching circuit SW4 is composed of PNP transistors Q57, Q60 for a differential switch, an NPN transistor Q53 for output-stage driving, and diodes Q61, Q52. The current source I4 is connected between the emitter common connection node of the differential switch transistors Q57, Q60 and the Vcc line 1.

The output voltage of the BTL amplifier 11 may rise above the threshold value which is similar Vcc/2 assigned to one of the intermediate power-supply lines. In this case, the switching circuits SW3 and SW4 connect the output-stage transistors (provided in the upper part of the output bridge circuit) to a power-supply line assigned with the voltage is higher than the threshold value which is more similar to the threshold value than the voltage assigned to any other power-supply line (in the embodiment, the Vcc line 1). Further, the switching circuit SW3 and SW4 changes the driving current of the output-stage transistors.

In other words, the four switching circuits SW1 to SW4 in the two-stage stacked amplifier section shown in FIGS. 5, 6, and 7 each have the function of not only substantially switching between the power-supply lines 1, 2, 3 to which the output bridge circuit is connected, in such a manner that the operating power-supply voltage of the output bridge circuit increases stepwise as the output voltage level of each of the BTL amplifiers 11, 12 increases and that the number of stages of stacked output bridge circuits of the BTL amplifiers 11, 12 between the power-supply rails 1, 2 is increased stepwise, but also switching the driving current of the output-stage transistors.

Next, the principle of the two-stage stacked amplifier section shown in FIGS. 5, 6, and 7 will be described in detail by reference to FIGS. 2 to 4.

First, the operation of the second BTL amplifier 12 of FIG. 6 will be explained.

After being amplified by the gm amplifier Gm1, the input signal A supplied to the input terminal IN-1 is further amplified by the gm amplifier Gm2 and supplied as a differential signal to the gm amplifier Gm3 and gm amplifier Gm4.

The output signal of the gm amplifier Gm3 is supplied to the bases of the output-stage driving transistors Q7, Q8 by way of the Darlington-connected transistors Q1, Q2. The output-stage driving transistor Q7 drives the output-stage power transistor Q14. The output-stage driving transistor Q8 drives the output-stage power transistor Q11 or Q15 by way of the switching circuit SW1.

The output signal of the gm amplifier Gm4 is supplied to the bases of the output-stage driving transistors Q23, Q22 by way of the Darlington-connected transistors Q30, Q27. The output-stage driving transistor Q23 drives the output-stage power transistor Q17. The output-stage driving transistor Q22 drives the output-stage power transistor Q20 or Q16 by way of the switching circuit SW2.

This allows the right and left sides of the output bridge circuit to be driven complementarily by signals of opposite polarity, which enables the BTL amplifier 12 to operate.

In this case, in the differential circuit (switching circuit SW1) for switching between the output-stage transistors Q11 and Q15, when the voltage at the first output node N1 of the output bridge circuit is higher than Vcc/2, of the transistors Q6, Q10 constituting a differential switch, the transistor Q6 turns on and the transistor Q10 turns off, thereby supplying a driving current to the small-signal power transistor Q11. Then, when the voltage at the first output node N1 goes down close to Vcc/2, the transistor Q6 turns off and the transistor Q10 turns on, thereby switching the supply of the driving current from the small-signal power transistor Q11 to the large-signal power transistor Q15. In this case, the diode Q13 acting as a level shifter has the function of switching the differential switch before the small-signal power transistor Q11 has been saturated.

Similarly, in the differential circuit (switching circuit SW2) for switching between the output-stage transistors Q20 and Q16, when the voltage at the second output node N2 of the output bridge circuit is higher than Vcc/2, of the transistors Q24, Q21 constituting a differential switch, the transistor Q24 turns on and the transistor Q21 turns off, thereby supplying a driving current to the small-signal power transistor Q20. Then, when the voltage at the second output node N2 goes down close to Vcc/2, the transistor Q24 turns off and the transistor Q21 turns on, thereby switching the supply of the driving current from the small-signal power transistor Q20 to the large-signal power transistor Q16. In this case, the diode Q19 acting as a level shifter has the function of switching the differential switch before the small-signal power transistor Q20 has been saturated.

Next, the operation of the first BTL amplifier 11 of FIG. 7 will be explained.

After being amplified by the gm amplifier Gm5, the input signal B supplied to the input terminal IN-2 is further amplified by the gm amplifier Gm6 and supplied as a differential signal to the gm amplifier Gm7 and gm amplifier Gm8.

The output signal of the gm amplifier Gm7 is supplied to the output-stage driving transistors Q42, Q43 by way of the Darlington-connected transistors Q36, Q38. The output-stage driving transistor Q42 drives the output-stage power transistor Q46. The output-stage driving transistor Q43 drives the output-stage power transistor Q47. Then, the output-stage transistor Q44 drives the output-stage power transistor Q48.

The output signal of the gm amplifier Gm8 is supplied to the output-stage driving transistors Q55, Q54 by way of the Darlington-connected transistors Q62, Q56. The output-stage driving transistor Q55 drives the output-stage power transistor Q51. The output-stage driving transistor Q54 drives the output-stage power transistor Q50. Then, the output-stage driving transistor Q53 drives the output-stage power transistor Q49.

This allows the right and left sides of the output bridge circuit to be driven complementarily by signals of opposite polarity, which enables the BTL amplifier 11 to operate.

The amplifying operation of the first BTL amplifier 11 is basically the same as that of the second BTL amplifier 12. Specifically, in the differential circuit (switching circuit SW3) for switching between the output-stage power transistors Q47 and Q48, when the voltage at the first output node N3 of the output bridge circuit is lower than Vcc/2, of the transistors Q39, Q35 constituting a differential switch, the transistor Q39 turns on and the transistor Q35 turns off, thereby supplying a driving current to the small-signal power transistor Q47. Then, when the voltage at the first output node N3 goes up close to Vcc/2, the transistor Q39 turns off and the transistor Q35 turns on, thereby switching the supply of the driving current from the small-signal power transistor Q47 to the large-signal power transistor Q48.

Similarly, in the differential circuit (switching circuit SW4) for switching between the output-stage power transistors Q50 and Q49, when the voltage at the second output node N4 of the output bridge circuit is lower than Vcc/2, of the transistors Q57, Q60 constituting a differential switch, the transistor Q57 turns on and the transistor Q60 turns off, thereby supplying a driving current to the small-signal power transistor Q50. Then, when the voltage at the second output node N4 goes up close to Vcc/2, the transistor Q57 turns off and the transistor Q60 turns on, thereby switching the supply of the driving current from the small-signal power transistor Q50 to the large-signal power transistor Q49.

Under the above-described operating principle, when the peak of the output signal is lower than Vcc/2, the small-signal mode operation is carried out as shown in FIG. 2. As a result, the signals from the pair of output nodes N1, N2 of the second BTL amplifier 12, the signals from the pair of output nodes N3, N4 of the first BTL amplifier 11, and the differential output signal applied to the actual speakers SP-1, SP-2 have the waveforms as shown in FIGS. 3A, 3B, and 3C, respectively.

At this time, when the relationship between the signals on each channel fulfills A=B or A=−B, current flows from the power supply Vcc through the power transistors corresponding to channel A and channel B in the direction shown by the arrow in FIG. 2, which prevents the operating current difference (differential current) ΔI between the vertically adjacent amplifiers from occurring.

As described earlier, FIG. 2 shows the current route in a half cycle of the signal. In the next half cycle where the phase is reversed, current flows in the output-stage transistors on the opposite side (not shown). Such operations are repeated alternately, thereby supplying the output current to the speakers SP-1, SP-2.

In contrast, when the peak of the output signal is higher than Vcc/2, the large-signal mode operation is carried out as shown in FIG. 2. As a result, the signals from the pair of output nodes N1, N2 of the second BTL amplifier 12, the signals from the pair of output nodes N3, N4 of the first BTL amplifier 11, and the differential output signal applied to the actual speakers SP-1, SP-2 have the waveforms as shown in FIGS. 4A, 4B, and 4C, respectively.

Specifically, when the amplitude peak of the output signal is going to exceed Vcc/2, the transistor in the lower part of the output bridge circuit of the second BTL amplifier 12 on the channel A side changes from the small-signal driving power transistor Q11 or Q20 to the large-signal driving power transistor Q15 or Q16, and the transistor in the upper part of the output bridge circuit of the first BTL amplifier 11 on the channel B side changes from the small-signal driving power transistor Q47 or Q50 to the large-signal driving power transistor Q48 or Q49. As a result, the first and second BTL amplifiers substantially operate as BTL amplifiers with a power-supply potential of Vcc.

In this case, the intermediate bias potential at the output node of the first BTL amplifier 11 on the channel B side is set at Vcc/4 and the intermediate bias potential at the output node of the second BTL amplifier 12 on the channel A side is set at 3 Vcc/4. These potentials are offset from Vcc/2, the intermediate bias potential at the output node of a conventional BTL amplifier. As seen from the waveforms shown in FIGS. 4A and 4B, the output clips are unbalanced. The BTL output, however, presents a distortion-free waveform as shown in FIG. 4C.

Because the waveform of one of the BTL output signals is clipped when the peak of the magnitude of the output signal has exceeded Vcc/2, the magnitude of the other signal must be doubled to prevent the waveform of the BTL output signal from being distorted.

To achieve this, differential feedback circuits DNF1, DNF2 are provided in such a manner that they correspond to the BTL amplifiers 11, 12. The differential feedback circuits DNF1, DNF2 can be realized relatively easily by applying differential feedback from both of the ends of the load circuits (the load impedances RL-1, RL-2 of the speakers SP-1, SP-2) to the input amplifiers. With the differential feedback, the signals at both of the ends of the load circuits present distortion-free waveforms until both of the upper and lower ends of the output waveform have been eventually clipped.

The effect of the two-stage stacked amplifier section constructed as shown in FIGS. 5, 6, and 7 will be explained.

In the small-signal mode, because the current discarded on the channel A side is recycled on the channel B side, the efficiency doubles. In contrast, in the large-signal mode, because the efficiency doubles in the part of the output waveform corresponding to a small signal and remains unchanged in the part exceeding Vcc/2, the efficiency is improved in the range from once to twice. That the efficiency doubles means that the power consumption (or heat generation) of the power amplifier with the same output is reduced to less than half, not half.

In the two-stage stacked amplifier section of FIGS. 6 and 7, differential amplifiers of such a simple structure as compares the output voltage directly with Vcc/2 are used as the differential switches of the switching circuits SW1 to SW4, which makes the switching speed of the differential switches very fast. Therefore, a delay in switching for a change in the output signal can be ignored. This means that the delay circuit provided to adjust switching as in a conventional class SB amplifier can be eliminated.

Figure 8:
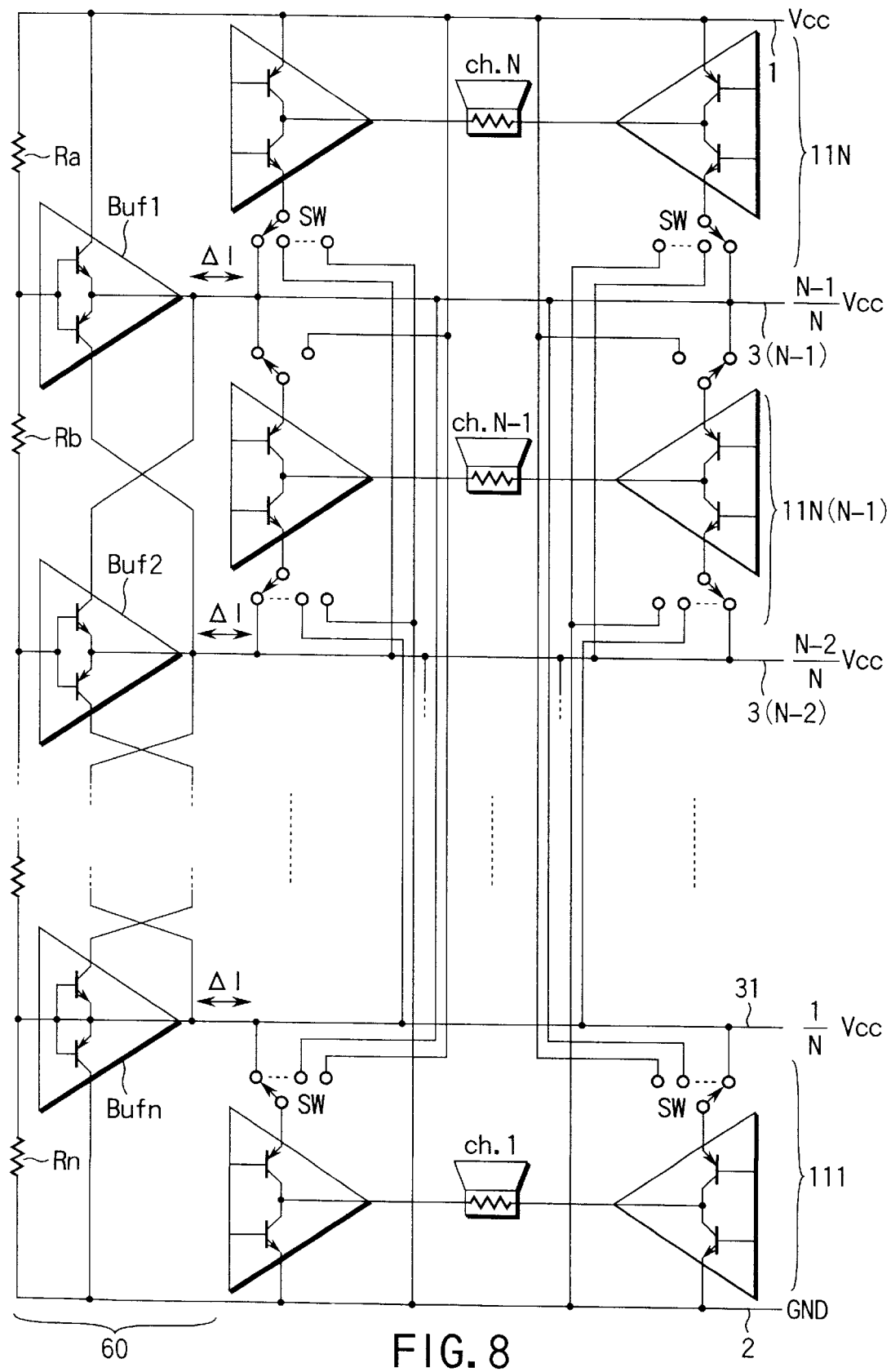
FIG. 8 is a circuit diagram illustrating the basic configuration of the N-stage stacked amplifier in a high-efficiency power amplifier according to a second embodiment of the present invention.
Figure 9:
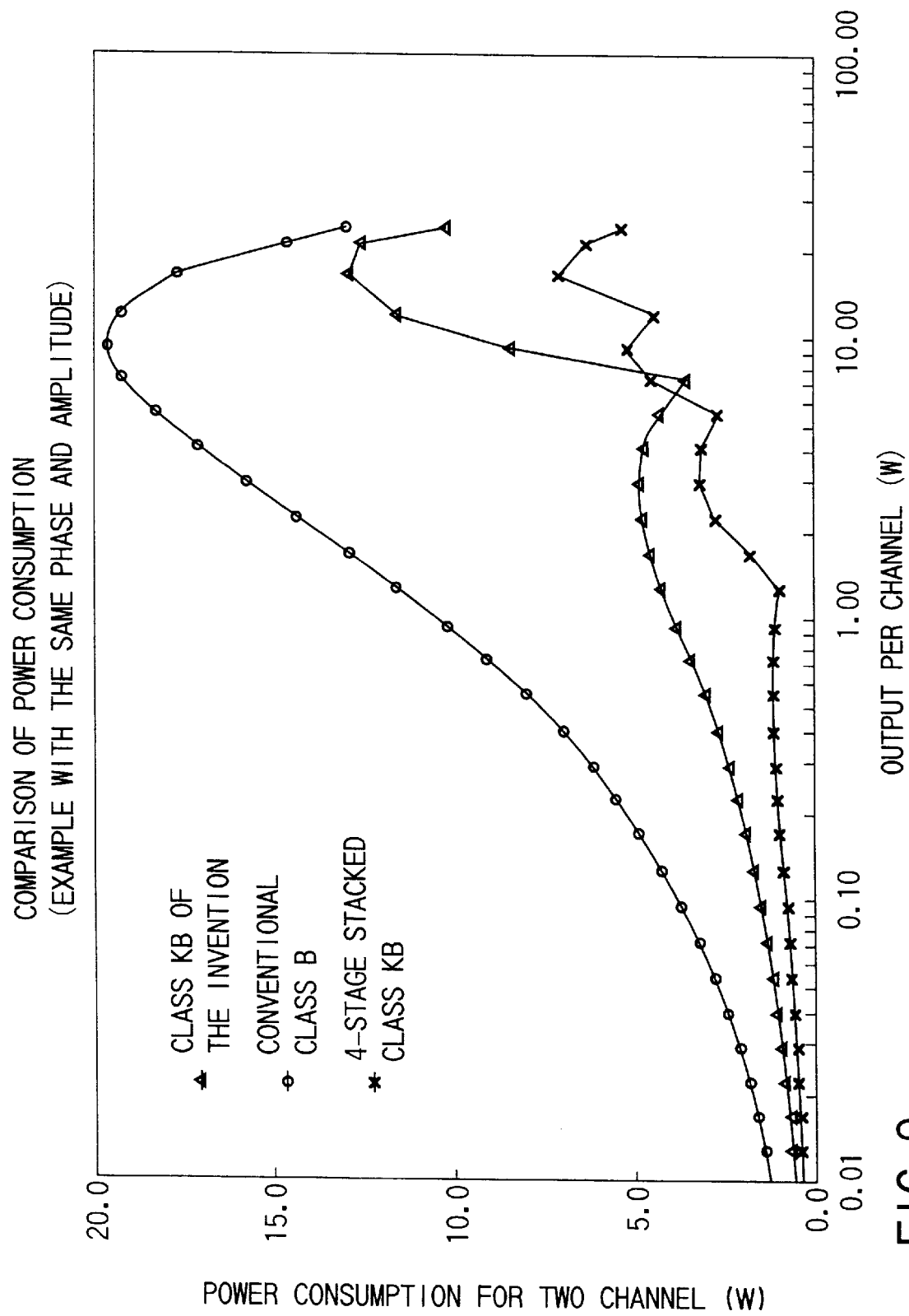
FIG. 9 is a graph illustrating the comparison of a theoretical power consumption of high-efficiency power amplifiers according to the first and second embodiments of the present invention with that of a conventional class B amplifier.

FIG. 9 is a graph of the result of calculating power consumption on the basis of a theoretical analysis, explained later, when each of the load impedance RL-1, RL-2 of the speakers SP-1, SP-2 is 4 Ω with Vcc=14 V, in a conventional class B amplifier, a power amplifier according to the first embodiment of the present invention, and a power amplifier according to a second embodiment of the present invention of FIG. 8, which will explained later. The abscissa indicates the output (W) per channel and the ordinate indicates the power consumption for two channels.

In FIG. 9, the comparison under the conditions of the same output has shown that the class B amplifier has the largest power consumption (heat generation) over the entire output range. In the case of the power amplifiers of the present invention, under the most favorable conditions (or when the output has the same or opposite phase and the same amplitude of Vcc/2), the theoretical efficiency is twice as high as that of the class B amplifier and the theoretical power consumption (heat generation) is about 1/5.7 of that of the class B amplifier.

With the power amplifier of the present invention, in the worst case where no improvement in the efficiency is made, that is, the case where all of the operating current at small signal input shown at the bottom of FIG. 2 becomes a differential current of ΔI, only one of the two channels (in the example, channel A) outputs the signal and the other channel outputs no signal. In this case, the efficiency is the same as that of the class B amplifier. The worst case, however, rarely occurs in actual stereo sound sources. If it should happen, the amount of heat generated in the entire amplifier system will be half that of full two channels operating, because the worst case has occurred, the amplifier of one channel (in the embodiment, channel B) is in the mode where the amplifier consumes no electric power. Therefore, this will not worsen the heat problem.

With an ordinary stereo sound source, the correlation between the right and left channel signals is high and the average output is considerably small for the peak of the amplitude. As a result, the efficiency twice as high as that of the conventional B class amplifier is expected in practical use and the heat generation is reduced remarkably.

The same principle on which the right and left channels are based applies to the front and back channels of the four-channel stereo.

The preamplifiers at the front stage or the power transistor at the driving stage may be difficult to stack one on top of the other between the power-supply rails from the viewpoint of circuitry. The operating current in the amplifiers is very small as compared with the operating current in the power transistors, which has a little effect on the efficiency.

The inventors of the present invention have decided to call a high-efficiency power amplifier of the invention a class KB (Keyed class-B or Keyed BTL) amplifier.

FIG. 8 is a block diagram illustrating the basic configuration of an N-stage stacked class KB amplifier in a high-efficiency power amplifier according to a second embodiment of the present invention.

The high-efficiency power amplifier is such that an N (an arbitrary integer ≧2) number of sets of BTL amplifiers are stacked one on top of another between power-supply rails 1 and 2. It is obtained by expanding the two-stage stacked amplifier of FIG. 1 into an N-stage stacked amplifier.

Specifically, in FIG. 8, a Vcc line 1 and a GND line 2 constitute power-supply rails. A power-supply voltage divider 60 divides the power-supply voltage between the power-supply rails into plural parts (N) (in the second embodiment, into equal parts) and outputs a first to (N−1)th divided potentials. The divided potentials become higher stepwise in ascending order from the ground potential to the power-supply potential. The first to (N−1)th power-supply divided potentials are supplied to an (N−1) number of intermediate power-supply lines 31 to 3(N−1), respectively.

The number of a first to N-th BTL amplifiers 111 to 11N is the same as the number (N) of parts into which the power-supply voltage divider 60 divides the voltage. A first channel to an N-th channel signal are inputted to the first amplifier 111 at the bottom of FIG. 8 and up to the N-th amplifier 11N at the top, respectively. In addition, there is provided a bias setting circuit (not shown) for setting intermediate voltages lower than the first divided potential to power-supply potential and higher than the ground potential to (N−1)th divided potential as the output bias potentials for the first to N-th BTL amplifiers 111 to 11N.

The switching circuits SW, SW, . . . are provided in such a manner that they correspond to the output bridge circuits of the BTL amplifiers 111 to 11N. They are controlled so as to substantially switch the power-supply lines to which the output bridge circuits are connected in such a manner that the operating power-supply voltage of the corresponding output bridge circuit increases stepwise as the output voltage level of each of the BTL amplifiers 111 to 11N increases.

In other words, the switching circuits SW, SW, . . . are designed to effect switching so as to change the number of stacked output bridge circuits of the BTL amplifiers 111 to 11N between the power-supply rails 1, 2 stepwise as the output voltage level of each of the BTL amplifiers 111 to 11N increases. In this case, when no signal is inputted to the BTL amplifiers 111 to 11N, the switching circuits SW, SW, . . . connect the output bridge circuits of the first to N-th BTL amplifiers 111 to 11N to a potential between the first divided potential and the ground potential up to a potential between the power-supply potential and the (N−1)th divided potential. The output voltage of the BTL amplifier may falls below a threshold value which is assigned to one of the intermediate power-supply lines. In this case, the switching circuits SW, SW, . . . connect the output bridge circuits to a power-supply line assigned with the voltage which is lower than the threshold value and which is more similar to the threshold value than the voltage assigned to any other power-supply line for the power-supply rail. The output voltage of the BTL amplifier may rise above such a threshold. In this case, the switching circuits SW, SW, . . . connect the output bridge circuits to a power-supply line assigned with the voltage is higher than the threshold value which is more similar to the threshold value than the voltage assigned to any other power-supply line for the power-supply rail.

Furthermore, there is provided a circuit (for example, a differential feedback circuit, not shown) for making the differential output signal waveforms of the BTL amplifiers 111 to 11N proportional to the corresponding input signal waveforms and keeping the instantaneous differential gains of the BTL amplifiers 111 to 11N almost constant.

The power-supply voltage divider 60 includes a resistance voltage divider and an (N−1) number of buffer circuits Buf1 to Bufn. The resistance voltage divider is composed of an N number of resistive elements Ra to Rn connected in series between the power-supply rails. The (N−1) number of buffer circuits Buf1 to Bufn are given biases from an (N−1) number of voltage dividing nodes of the resistance voltage divider and each include a push-pull emitter follower circuit at its output stage. In addition, an (N−1) number of intermediate power-supply lines 31 to 3(N−1) are connected to the output nodes of the (N−1) buffer circuits Buf1 to Bufn, respectively. In this case, the emitter follower circuit of each of the buffer circuits Buf1 to Bufn may be connected between the power-supply rails. In the second embodiment, the emitter follower circuit is connected between two power-supply lines one stage above and below the corresponding intermediate power-supply line (or between the substantial power-supply rails). This enables the current flowing through the emitter follower circuit to be recycled, which improves the efficiency.

Bypass capacitors, power switches, and others are connected as in the two-stage stacked amplifier described above.

The operation of the N-stage stacked class KB amplifier of FIG. 8 will be explained briefly.

In the N-stage stacked class KB amplifier, the N number of sets of BTL amplifiers 111 to 11N are stacked one on top of another between the power-supply rails 1, 2. The audio signals on the first to N-th channels ch. 1 to ch. N are inputted to the N number of sets of BTL amplifiers 111 to 11N, respectively. Each of the stacked BTL amplifiers 111 to 11N for N channels, at small signal input, substantially acts as a BTL amplifier with a substantial power-supply potential of Vcc/N and, at large signal input, act as a BTL amplifier with a power-supply potential of n·Vcc/N (n is an integer in the range of $2 \leq n \leq N$).

Specifically, at small signal input, the substantial power-supply potential applied to the BTL amplifiers 111 to 11N is Vcc/N. At intermediate to large signal input, as the signal gets larger, the substantial power-supply potential applied to the BTL amplifiers is increased in steps of Vcc/N. For example, on the first channel at the bottom, at small signal input, the upper one of the output-stage power transistors is connected to the intermediate power-supply line 31 with Vcc/N. When the instantaneous potential of the output signal has exceeded Vcc/N, the transistor is switched from the intermediate power-supply line 31 to the intermediate power-supply line with 2·Vcc/N above the line 31. As the magnitude of the output signal increases, the upper power transistor at the output stage is connected to the intermediate power-supply line with 3·Vcc/N, the intermediate power-supply line with 4·Vcc/N, . . . , the intermediate power-supply line 3(N−1) with (N−1)·Vcc/N in that order, and finally to the Vcc line 1. In each of the BTL amplifiers excluding the one at the bottom and the one at the top, a switching circuit is provided for the upper and lower ones of the output-state power transistors and switches between the power-supply lines according to the output voltage.

The difference ΔI between the operating currents of the two BTL amplifiers adjacent to each other vertically is absorbed by the buffer circuits Buf1 to Bufn of the power-supply voltage divider 60 connected to the intermediate power-supply line common to the two BTL amplifiers.

A theoretical analysis explained later has shown that, when the supplied signal has the optimum level and phase (or when the supplied signal has the non-clip maximum amplitude in the small signal mode and all the amplifiers produce the outputs of the same or opposite phase with the same level), the theoretical power efficiency of the N-stage stacked class KB amplifier of FIG. 8 is N times as high as that of the class B amplifier and the theoretical power consumption (heat generation) is reduced remarkably to (4−π)/(4N−π) of that of the class-B amplifier. In the case of a four-stage stacked class-KB amplifier with N=4, when the supplied signal has the optimum level and phase (or when the supplied signal has the non-clip maximum amplitude in the small signal mode and all the amplifiers produce the outputs of the same or opposite phase with the same level), the theoretical power efficiency is four times as high as that of the class B amplifier and the theoretical power consumption (heat generation) is reduced to about 1/15 of that of the class B amplifier.

Even in an actual case where the driving power at the power stage and the fixed power consumption in the peripheral circuits, including the preamplifier section, develop, use of the configuration of the two-stage stacked amplifier section shown in FIGS. 1, 5, 6, and 7 enables the amount of heat generated in the amplifiers with practical musical sound signal to be reduced by half.

The effect of the N-stage stacked class KB amplifier will be explained.

In an ordinary class B amplifier, all the currents flowing into the N number of loads are supplied in parallel from the power-supply rails 1, 2.

In contrast, with N-stage stacked class KB amplifier, under the optimum conditions where the efficiency is improved most (or when all the channels are in the minimum power-supply mode and the amplifiers produce the non-clip maximum outputs of the same or opposite phase with the same level or produce the BTL outputs with an amplitude of Vcc/N), the current from the Vcc flows through the N number of loads in series, from the load of the BTL amplifier output at the top stage down to the load of the BTL amplifier output at the bottom stage, thereby driving the speakers. As a result, under the optimum conditions, the efficiency of the N-stage stacked class KB amplifier is N times as high as that of an ordinary class B amplifier and the power consumption (heat generation) is reduced to $(4-\pi)/(4N-\pi)$ of that of the class B amplifier. When N=4, under the optimum conditions, the efficiency is four times as high as that of the class B amplifier and the power consumption is about 1/15 of that of the ordinary class B amplifier. The optimum conditions for the efficiency are the optimum conditions under which the power consumption is reduced most.

For intuitive understanding, FIG. 9 shows the result of making calculations for a conventional class B amplifier and class-KB amplifier (N=2 and 4) of the invention with Vcc=14 V and RL=4 Ω. In FIG. 9, the abscissa indicates the output power per channel and the ordinate indicates the power consumption for two channels. It can be seen from the figure that the power consumption is reduced remarkably over the entire output range.

The conventional class SB amplifier is essentially not based on the concept of the N-stage stacked structure and has as high an efficiency as that of the two-stage stacked class KB amplifier at best. When a large-capacity capacitor is not used at the mid-point, the efficiency for the opposite signal is not improved. In other words, one of the great advantages of the class KB amplifier of the present invention is that the power consumption is reduced remarkably by using an arbitrary number of stacked stages.

In the embodiment, the voltage between the power-supply rails 1, 2 has been divided into N equal parts and the divided voltages have been used as the reference voltages for the individual power-supply lines. When the average output powers of the stacked BTL amplifiers 111 to 11N differ, the efficiency is further improved by distributing higher voltages to BTL amplifiers with higher average outputs and lower voltages to BTL amplifiers with lower average outputs. In the embodiment, the power-supply lines to which the output bridge circuits are connected are switched in such a manner that the operating power-supply voltage of the corresponding output bridge circuit increases stepwise as the output voltage level of each of the BTL amplifiers 111 to 11N increases. Instead of increasing the voltage stepwise, the connection to the power-supply lines may be switched in such a manner that the operating power-supply voltage increases in large steps (in steps of more than Vcc/N).

When the distortion of the output waveform is not a problem as in an actuator driver, the power amplifier of the second embodiment, like that of the first embodiment, does not require a circuit (for example, a differential feedback circuit) for keeping the instantaneous differential gains of the bias setting circuit and BTL amplifiers 11, 12 almost constant. Even without such a circuit, it is possible to provide a power amplifier capable of amplifying signals on plural channels at high efficiency with less heat generation.

While in the first and second embodiments, bipolar transistors have been used, MOS transistors may be used to construct a similar configuration to that of the first and second embodiments.

Hereinafter, the result of comparing the class KB amplifier of the present invention with conventional various amplifiers will be explained.

(1) The class KB amplifier outperforms the class SB amplifier with relatively high efficiency in the following points:
  (a) The former enables an arbitrary N-stage configuration and makes the theoretical efficiency N times as high as that of the latter.
  (b) The former uses only unidirectional power switches and therefore has a single configuration.
  (c) The former has a smaller number of power switches and therefore fewer elements in the case of a two-channel configuration.
  (d) The former improves the efficiency for not only the same phase signal but also the opposite phase signal.
  (e) The former matches the output signal well with the switching timing signal and therefore needs no delay circuit.
  (f) The former enables amplifiers with different average outputs to be used efficiently in its configuration by nonlinear power-supply division.
  (g) The former enables an odd-number channel configuration, such as a three-channel configuration.

(2) The class KB amplifier outperforms the class-D amplifier in the following points:
  (a) The former does not effect high-frequency switching, resulting in almost no unnecessary radiation.
  (b) The former needs no large-capacity low-pass filter for preventing high-frequency leakage.
  (c) The former needs no shielding case for reducing unnecessary radiation.
  (d) The former has a simple circuit configuration and a smaller number of circuit elements.
  (e) The former allows its circuits to operate at low speed and therefore enables production by low-cost processes.

(3) The class KB amplifier outperforms the class G amplifier in the following points:
  (a) The former allows a single power supply to be used as the main power supply.
  (b) The former enables an arbitrary N-stage configuration and makes the theoretical efficiency N times as high as that of the latter.
  (c) The former uses a smaller number of power switches and therefore has a single configuration.

(4) The class KB amplifier outperforms the class-H amplifier in the following points:
  (a) The former requires neither a lift-up power amplifier nor a large-capacity capacitor.
  (b) The former enables an arbitrary N-stage configuration and makes the theoretical efficiency N times as high as that of the latter.

(c) The former uses a smaller number of power switches and therefore has a single configuration.

[Theoretical Analysis]

(1) Conventional class B amplifier

Hereinafter, it is assumed that the average is calculated in half a period (π radians)

The average input power of a sine wave is expressed as:

$$\overline{P_{inB}} = \frac{V_{cc}I_m}{\pi}\int_0^\pi \sin\omega t \cdot d(\omega t) = \frac{2}{\pi}I_m V_{cc} = \frac{2V_m V_{cc}}{\pi R_L} \quad (1)$$

$$\because V_m = R_L I_m$$

where Vcc is the power-supply rail voltage, Im is the output current amplitude, Vm is the output voltage amplitude, ω is the angular frequency, t is time, and RL is the load resistance.

The output power of a sine wave is expressed as:

$$\overline{P_{oB}} = \frac{I_m^2 R_L}{\pi}\int_0^\pi \sin^2\omega t \cdot d(\omega t) = \frac{I_m^2 R_L}{2} = \frac{V_m^2}{2R_L} \quad (2)$$

The efficiency η is expressed as:

$$\eta_B = \frac{\overline{P_{oB}}}{\overline{P_{inB}}} = \frac{\pi V_m}{4V_{cc}} \quad (3)$$

It is well known that when the output instantaneous potential has reached the power-supply potential, or when Vm=Vcc, the efficiency becomes the highest and the maximum efficiency is expressed as:

$$\eta_{Bmax} = \left[\frac{\pi V_m}{4V_{cc}}\right]_{V_m=V_{cc}} = \frac{\pi}{4} = 0.7854 \approx 78.5\% \quad (4)$$

The power consumption is expressed as:

$$\overline{P_{dB}} = \overline{P_{inB}} - \overline{P_{oB}} = \frac{2V_m V_{cc}}{\pi R_L} - \frac{V_m^2}{2R_L} \quad (5)$$

The condition under which the power consumption become the greatest will be calculated as follows:

$$\frac{\partial \overline{P_{dB}}}{\partial V_m} = \frac{2V_{cc}}{\pi R_L} - \frac{V_m}{R_L} = 0 \quad (6)$$

$$\therefore V_m = \frac{2}{\pi}V_{cc} \approx 0.6366 V_{cc}$$

Specifically, when the output amplitude is about 64% of the power-supply rail voltage, the power consumption becomes the greatest. The maximum power consumption will be expressed as:

$$\overline{P_{dB\,max}} = \frac{2V_{cc}}{\pi R_L}\cdot\frac{2V_{cc}}{\pi} - \frac{1}{2R_L}\cdot\frac{4V_{cc}^2}{\pi^2} = \frac{2V_{cc}^2}{\pi^2 R_L} \quad (7)$$

Furthermore, the ratio of the output power to the maximum output when the power consumption is the greatest is expressed as:

$$\frac{\overline{P_{oB\,Pdmax}}}{\overline{P_{oB\,max}}} = \frac{1}{2R_L}\left(\frac{2V_{cc}}{\pi}\right)^2 \Big/ \frac{V_{cc}^2}{2R_L} = \frac{4}{\pi^2} \approx 0.4052 \quad (8)$$

Namely, the power consumption (heat generation) becomes the greatest near 40% of the maximum output.

(2) Two-stage stacked class KB amplifier of the present invention

Because the average input power in the small-signal mode is basically the same as that of the class B BTL with a power-supply potential of Vcc/2, it can be determined easily by using the result of calculations in the class-B amplifier as follows:

$$\overline{P_{inKB\,small}} = \frac{V_m V_{cc}}{\pi R_L} \quad (9)$$

Because the sine wave output power is identical with that of the class B amplifier, it is expressed by the following equation:

$$\overline{P_{oKB}} = \frac{V_m^2}{2R_L} \quad (10)$$

Thus, the efficiency in the small-signal mode is expressed as:

$$\eta KB_{small} = \frac{\overline{P_{oKB}}}{\overline{P_{inKB\,small}}} = \frac{\pi V_m}{2V_{cc}} \quad (11)$$

The efficiency is twice as high as that of the class B amplifier.

Next, the above factors in the large signal mode will be considered. Hereinafter, the average is assumed to be calculated in a quarter of a period.

First, the average input power of a sine wave is expressed by the following equation:

$$\overline{P_{inKB\,large}} = \frac{V_{cc}I_m}{\pi}\int_0^\theta \sin\omega t \cdot d(\omega t) + \quad (12)$$

$$\frac{2V_{cc}I_m}{\pi}\int_\theta^{\pi/2} \sin\omega t \cdot d(\omega t)$$

$$= \frac{V_{cc}}{2\pi R_L}\left(2V_m + \sqrt{4V_m^2 - V_{cc}^2}\right)$$

$$\because V_m = R_L I_m$$

The first item in equation (12) is the input power in the small-signal mode with a substantial power-supply potential of Vcc/2. The second item in equation (12) is the input power in the large-signal mode with a substantial power-supply potential of Vcc.

In addition, θ in equation (12) is the phase angle when the small signal mode is changed to the large signal mode. It is expressed by the following equation:

$$\theta = \sin^{-1}\left(\frac{V_{cc}}{2V_m}\right), \quad \therefore \cos\theta = \frac{\sqrt{4V_m^2 - V_{cc}^2}}{2V_m} \quad (13)$$

The remaining symbols in equation (12) follow the like ones in the conventional class-B amplifier in item (1).

Next, the output power of a sine wave is identical with that in the class-B amplifier, it is expressed by the following equation:

$$\overline{P_{oKB}} = \frac{V_m^2}{2R_L} \quad (14)$$

The efficiency η in the large-signal mode is expressed by the following equation:

$$\eta KB_{large} = \frac{\overline{P_{oKB}}}{\overline{P_{inKB}}_{large}} = \frac{\pi V_m^2}{V_{cc}\left(2V_m + \sqrt{4V_m^2 - V_{cc}^2}\right)} \quad (15)$$

In equation (15), η has a maximal value when Vm is at Vcc/2 and Vcc. A maximal value when Vm is at Vcc/2 and a maximal value when Vm is at Vcc are expressed by the following equations:

$$[\eta KB]_{Vm \cdot Vcc/2} = \frac{\pi}{4} = 0.7854 \approx 78.5\%$$
$$[\eta KB]_{Vm \cdot Vcc} = \frac{\pi}{2+\sqrt{3}} = 0.8417 \approx 84.2\% \quad (16)$$

The power consumption is expressed as:

$$\overline{P_{dKB}} = \overline{P_{inKB}} - \overline{P_{oKB}} \quad (17)$$

FIG. 9 shows the result of substituting actual values into equation 17.

The abscissa indicates the output (W) per channel and the ordinate indicates the power consumption (heat generation) for two channels. In FIG. 9, the curve marked with ○-○ indicates the result of the conventional class-B amplifier, the curve marked with Δ-Δ indicates the result of the two-stage stacked class-KB amplifier of the invention, and the curve marked with X-X indicates the result of the four-stage stacked class-KB amplifier of the invention.

(3) Four-stage stacked class-KB amplifier of the present invention

For simplification, the average is assumed to be calculated in a quarter of a period.

The average input power of a sine wave will be calculated.

The average input power when 3 Vcc/4<Vm (or at large signal input) is expressed as:

$$\overline{P_{inKB4}} = \frac{2V_{cc}I_m}{\pi}\left\{\frac{1}{4}\int_0^{\theta_1} \sin\omega t \cdot d(\omega t) + \frac{2}{4}\int_{\theta_1}^{\theta_2} \sin\omega t \cdot d(\omega t) + \frac{3}{4}\int_{\theta_2}^{\theta_3} \sin\omega t \cdot d(\omega t) + \int_{\theta_3}^{\pi/2} \sin\omega t \cdot d(\omega t)\right\} \quad (18)$$

$$= \frac{V_{cc}}{2\pi R_L}\left\{V_m + \sqrt{V_m^2 - \left(\frac{V_{cc}}{4}\right)^2} + \sqrt{V_m^2 - \left(\frac{2V_{cc}}{4}\right)^2} + \sqrt{V_m^2 - \left(\frac{3V_{cc}}{4}\right)^2}\right\}$$

$$\because V_m = R_L I_m$$

In equation (18), the first item indicates the input power when the substantial power-supply potential is Vcc/4, the second item indicates the input power when the power-supply potential is Vcc/2, and the third item indicates the input power when the power-supply potential is 3 Vcc/4. In addition, θ1, θ2, and θ3 in equation (18) indicate the signal phase angles when the output voltage amplitude has exceeded Vcc/4, Vcc/2, and 3 Vcc/4.

The average input power when Vcc/2<Vm<3 Vcc/4 (or at intermediate signal input) is expressed as:

$$\overline{P_{inKB4}} = \frac{2V_{cc}I_m}{\pi}\left\{\frac{1}{4}\int_0^{\theta_1} \sin\omega t \cdot d(\omega t) + \frac{2}{4}\int_{\theta_1}^{\theta_2} \sin\omega t \cdot d(\omega t) + \frac{3}{4}\int_{\theta_2}^{\pi/2} \sin\omega t \cdot d(\omega t)\right\} \quad (19)$$

$$= \frac{V_{cc}}{2\pi R_L}\left\{V_m + \sqrt{V_m^2 - \left(\frac{V_{cc}}{4}\right)^2} + \sqrt{V_m^2 - \left(\frac{2V_{cc}}{4}\right)^2}\right\}$$

The average input power when Vcc<4<Vcc/2 (or at the smaller intermediate signal input) is expressed as:

$$\overline{P_{inKB4}} = \frac{2V_{cc}I_m}{\pi}\left\{\frac{1}{4}\int_0^{\theta_1} \sin\omega t \cdot d(\omega t) + \frac{2}{4}\int_{\theta_1}^{\pi/2} \sin\omega t \cdot d(\omega t)\right\} \quad (20)$$

$$= \frac{V_{cc}}{2\pi R_L}\left\{V_m + \sqrt{V_m^2 - \left(\frac{V_{cc}}{4}\right)^2}\right\}$$

The average input power when 0<Vm<Vcc/4 (or at small signal input) is expressed as:

$$\overline{P_{inKB4}} = \frac{2V_{cc}I_m}{\pi}\left\{\frac{1}{4}\int_0^{\pi/2} \sin\omega t \cdot d(\omega t)\right\} \quad (21)$$

$$= \frac{V_{cc}V_m}{2\pi R_L}$$

In equation (19) to equation (21), θn (n=1, 2, 3) is the phase angle when the mode is changed from the small signal mode to the large signal mode progressively. It is expressed by the following equation:

$$\theta_1 = \sin^{-1}\left(\frac{V_{cc}}{4V_m}\right), \quad \theta_2 = \sin^{-1}\left(\frac{V_{cc}}{2V_m}\right), \quad \theta_3 = \sin^{-1}\left(\frac{3V_{cc}}{4V_m}\right) \quad (22)$$

Next, the degree of improvement in the power consumption will be compared between N-stage stacked class KB amplifiers under the optimum conditions, using the conventional class B amplifier as a reference.

The optimum conditions have been achieved when the individual channels have the same or opposite phase with the same amplitude and the amplitude of the output signal has reached the amplitudes of the N-stage division power-supply lines, that is, when Vm=Vcc/N.

The power consumption for N channels in the class-KB amplifier is expressed by the following equation:

$$\overline{P_{dKB \cdot N}} = \overline{P_{inKB\,total}} - \overline{P_{oKB\,total}} = \frac{2V_m V_{cc}}{\pi R_L} - \frac{NV_m^2}{2R_L} \quad (23)$$

The power consumption becomes the smallest at N points where Vm becomes 1/N, 2/N, . . . , and (N−1)/N of Vcc and Vcc. Of these points, the point where Vm becomes 1/N of Vcc is the best point at which the power consumption is reduced most as compared with the class-B amplifier.

Substituting Vm=Vcc/N into equation (23) gives the following equation:

$$\overline{P_{dKB}}_{\text{optimum}} = \frac{4-\pi}{2\pi N R_L} \cdot V_{cc}^2 \qquad (24)$$

On the other hand, the power consumption for N channels in the conventional class B amplifier is expressed by the following equation:

$$\overline{P_{dB \cdot N}} = \overline{P_{inB}}_{\text{total}} - \overline{P_{oB}}_{\text{total}} = \frac{4N-\pi}{2\pi N R_L} \cdot N V_{cc}^2 \qquad (25)$$

The ratio of the power consumption of the N-stage stacked class KB amplifier to that of the conventional class B amplifier is expressed by the following equation:

$$\frac{\overline{P_{dKB}}_{\text{optimum}}}{\overline{P_{dB \cdot N}}} = \frac{4-\pi}{4N-\pi} \qquad (26)$$

Substituting numerical values into equation (26) gives the following table:

TABLE 1

| Number of stacked stages N = | 2 | 3 | 4 | 5 | 6 |
|---|---|---|---|---|---|
| Power consumption reduction ratio | 1/5.66 | 1/10.32 | 1/14.98 | 1/19.64 | 1/24.30 |

As seen from the result, although use of a configuration with a large number of stacked stages is not feasible at present, future device technology and developments in high withstand voltage applications will enable the advantages of the present invention to find wide application.

As described above, with the present invention, it is possible to provide a power amplifier capable of amplifying signals on plural channels at a high efficiency with less heat generation.

In addition, it is possible to provide an audio-signal power amplifier suitable to realize a power amplifier system capable of amplifying audio signals on plural channels at a high efficiency with less heat generation.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A power amplifier comprising:

a pair of power-supply rails composed of a first power-supply line to which a power-supply potential regarded as an N-th potential is applied and a second power-supply line to which a ground potential is applied;

a power-supply voltage divider for dividing a voltage between the power-supply rails into first to (N−1)th potential which are sequentially higher from the first potential toward the (N−1)th potential;

an (N−1) number of intermediate power-supply line or lines to which the first to (N−1)th potentials are applied, respectively;

first to N-th BTL amplifiers connected to receive first to N-th channel signals, respectively, said first to N-th BTL amplifiers including output bridge circuits provided corresponding to the first to N-th BTL amplifiers, respectively, stacked one above another and connected between the power-supply rails; and switching circuits provided corresponding to the first to N-th BTL amplifiers, respectively, each designed to connect the output bridge circuit between one potential and the immediately higher potential when the BTL amplifier has no signals, and to change connection of the output bridge circuit when an output voltage level of the BTL amplifier increases, where N is integer $\geq 2$.

2. A power amplifier according to claim 1, further comprising a bias setting circuit for setting intermediate bias voltages each of which lower than said first potential to N-th potential and higher than said ground potential to (N−1)th potential as the output bias potentials for said first to N-th BTL amplifiers.

3. A power amplifier according to claim 1, further comprising a circuit for making differential output signal waveforms of said BTL amplifiers proportional to the corresponding input signal waveforms and keeping instantaneous differential gains of the BTL amplifiers almost constant.

4. A power amplifier according to claim 1, wherein said switching circuits switch voltages of junctions to which the output bridge circuits are connected in such a manner that operating voltages for the corresponding output-stage transistors increase stepwise as the output voltage levels of said BTL amplifiers get higher.

5. A power amplifier according to claim 1, wherein said switching circuits switch voltages of junctions to which the output bridge circuits are connected in such a manner that operating voltages for the corresponding output-stage transistors become larger stepwise by power-supply voltage/N as the output voltage levels of said BTL amplifiers get higher.

6. A power amplifier according to claim 1, wherein, when the output voltage level of the BTL amplifiers may fall below a threshold value which is assigned to one of the intermediate power-supply lines, the switching circuits connect the output bridge circuits to the intermediate power-supply line or power-supply rail assigned with a voltage which is lower than the threshold value and which is more similar to the threshold value than a voltage assigned to any other intermediate power-supply line or power-supply rail, and when the output voltage level of the BTL amplifiers may rise above a threshold value which is assigned to one of the intermediate power-supply lines, the switching circuits connect the output bridge circuits to the intermediate power-supply line or power-supply rail assigned with a voltage which is higher than the threshold value and which is more similar to the threshold value than a voltage assigned to any other intermediate power-supply line or power-supply rail.

7. A power amplifier according to claim 6, wherein said switching circuits are each a differential circuit which compares the output voltage of the corresponding BTL amplifier with the voltage of the intermediate power-supply line connected to the output bridge circuit of the BTL amplifier and effect switching according to the result of the comparison so as to select a substantial junction to which said output bridge circuit is connected.

8. A power amplifier according to claim 1, wherein the switching circuit corresponding to said first BTL amplifier selects a junction to which the output-stage transistor on the higher potential side of the output bridge circuit of the first BTL amplifier is connected, the switching circuit corresponding to said N-th BTL amplifier selects a junction to which the output-stage transistor on the lower potential side of the output bridge circuit of the N-th BTL amplifier is connected, and the switching circuit corresponding to said second to (N−1)th BTL amplifier select junctions to which the output-stage transistors on the lower and higher potential sides of the output bridge circuits of the corresponding BTL amplifiers are connected.

9. A power amplifier according to claim 8, wherein the output-stage transistors in each of the output bridge circuits of said BTL amplifiers are composed of output-stage transistors connected in such a manner that they correspond to the intermediate power-supply lines or said power-supply rails, respectively, and said switching circuits are each a differential circuit for comparing the output voltage of the corresponding BTL amplifier with the voltage of the intermediate power-supply line connected to the output-stage transistor of the BTL amplifier, selecting a specific one of said output-stage transistors according to the result of the comparison, and effecting switching so as to supply a driving signal.

10. A power amplifier according to claim 1, further comprising a low-frequency signal side path capacitor connected between said intermediate power-supply line and a line to which said ground potential is applied.

11. A power amplifier according to claim 1, wherein said power-supply voltage divider divides the voltage between said power-supply rails into N substantially equal parts.

12. A power amplifier according to claim 1, wherein said power-supply voltage divider divides the voltage between said power-supply rails nonlinearly into N parts so as to distribute an operating voltage according to the average output power of each of said BTL amplifiers.

13. A power amplifier according to claim 1, wherein said power-supply voltage divider includes a resistance voltage divider composed of an N number of resistive elements connected in series between said power-supply rails, and an (N−1) number of push-pull emitter follower circuits to which said resistance voltage divider applies the biases from its (N−1) voltage division nodes respectively and to the output nodes of which said (N−1) intermediate power-supply lines are connected, respectively.

14. A power amplifier according to claim 13, wherein each of the emitter follower circuit being connected to between intermediate power-supply lines or between the intermediate power-supply line and the power-supply rail one stage above and below the potential of the corresponding intermediate power-supply line to which the output of the emitter follower circuit is connected.

15. A power amplifier according to claim 1, wherein said N is two, and the number of said first to N-th BTL amplifiers is two.

16. A power amplifier comprising:

a first power-supply line to which a power-supply potential is applied;

a second power-supply line to which a ground potential is applied;

a third power-supply line to which a potential between said power-supply potential and said ground potential is applied;

a first BTL amplifier which includes first and second output bridge circuits connected between said second power-supply line and said third power-supply line and to which a first channel signal is inputted, said first output bridge circuit including a first transistor section one end of whose current path is connected to said second power-supply line and a second transistor section one end of whose current path is connected to the other end of the current path of said first transistor section, and said second output bridge circuit including a third transistor section one end of whose current path is connected to said second power-supply line and a fourth transistor section one end of whose current path is connected to the other end of the current path of said third transistor section;

a second BTL amplifier which includes third and fourth output bridge circuits connected between said first power-supply line and said third power-supply line and to which a second channel signal is inputted, said third output bridge circuit including a fifth transistor section one end of whose current path is connected to said first power-supply line and a sixth transistor section one end of whose current path is connected to the other end of the current path of said fifth transistor section, and said fourth output bridge circuit including a seventh transistor section one end of whose current path is connected to said first power-supply line and an eighth transistor section one end of whose current path is connected to the other end of the current path of said seventh transistor section;

a first switching circuit for selectively connecting the other end of the current path of said second transistor section to one of said first power-supply line and said third power-supply line;

a second switching circuit for selectively connecting the other end of the current path of said fourth transistor section to one of said first power-supply line and said third power-supply line;

a third switching circuit for selectively connecting the other end of the current path of said sixth transistor section to one of said second power-supply line and said third power-supply line; and a fourth switching circuit for selectively connecting the other end of the current path of said eighth transistor section to one of said second power-supply line and said third power-supply line.

17. A power amplifier according to claim 16, wherein in a small-signal mode, the route for the output signal current of said second BTL amplifier is formed from said first power-supply line via the current path of said fifth transistor section or said seventh transistor section, and the current path of said eighth transistor section or said sixth transistor section, to said third power-supply line, and the route for the output signal current of said first BTL amplifier is formed from said third power-supply line via the current path of said second transistor section or said fourth transistor section, the current path of said third transistor section or said first transistor section, to said second power-supply line, and in a large-signal mode, the route for the output signal current of said second BTL amplifier is formed from said first power-supply line via the current path of said fifth transistor section or said seventh transistor section, and the current path of said eighth transistor section or said sixth transistor section, to said second power-supply line, and the route for the output signal current of said first BTL amplifier is formed from said first power-supply line via the current path of said second transistor section or said fourth transistor section, and the current path of said third transistor section or said first transistor section, to said second power-supply line.

18. A power amplifier according to claim 16, further comprising a power-supply voltage divider for producing an intermediate potential by dividing the voltage between said first power-supply line and said second power-supply line and applying the intermediate potential to said third power-supply line.

19. A power amplifier according to claim 16, further comprising circuit for making differential output signal waveform outputted from said first or second BTL amplifier proportional to the corresponding input signal waveform and keeping instantaneous differential gain of said first or second BTL amplifier almost constant.

20. A power amplifier according to claim 19, wherein said circuit for keeping instantaneous differential gain of said first or second BTL amplifier almost constant is a differential feedback circuit composed of resistive elements.

* * * * *